US009601499B2

(12) United States Patent
Wu et al.

(10) Patent No.: US 9,601,499 B2
(45) Date of Patent: Mar. 21, 2017

(54) ONE-TIME PROGRAMMABLE MEMORY CELL CAPABLE OF REDUCING LEAKAGE CURRENT AND PREVENTING SLOW BIT RESPONSE, AND METHOD FOR PROGRAMMING A MEMORY ARRAY COMPRISING THE SAME

(71) Applicant: eMemory Technology Inc., Hsin-Chu (TW)

(72) Inventors: Meng-Yi Wu, Hsinchu County (TW); Wei-Zhe Wong, Hsinchu County (TW); Hsin-Ming Chen, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/005,012

(22) Filed: Jan. 25, 2016

(65) Prior Publication Data
US 2016/0141295 A1    May 19, 2016

Related U.S. Application Data

(63) Continuation-in-part of application No. 14/222,684, filed on Mar. 24, 2014, now Pat. No. 9,281,074.
(Continued)

(51) Int. Cl.
*G11C 17/14*       (2006.01)
*H01L 27/112*      (2006.01)
(Continued)

(52) U.S. Cl.
CPC ........ *H01L 27/11206* (2013.01); *G11C 17/16* (2013.01); *H01L 27/101* (2013.01);
(Continued)

(58) Field of Classification Search
CPC ..... G11C 17/165; G11C 17/146; G11C 17/14; G11C 17/18
See application file for complete search history.

(56) References Cited

U.S. PATENT DOCUMENTS 8,519,508 B2 *  8/2013  Kubota .............. H01L 23/5252
                                                  257/369
8,638,589 B2    1/2014  Lu
(Continued)

FOREIGN PATENT DOCUMENTS

CN       101127246 A    2/2008
CN       101887756 A    11/2010
(Continued)

*Primary Examiner* — Andrew Q Tran
(74) *Attorney, Agent, or Firm* — Winston Hsu; Scott Margo

(57) ABSTRACT

A one time programmable (OTP) memory cell includes a select gate transistor, a following gate transistor, and an antifuse varactor. The select gate transistor has a first gate terminal, a first drain terminal and a first source terminal. The following gate transistor has a second gate terminal, a second drain terminal and a second source terminal coupled to the first drain terminal. The antifuse varactor has a third gate terminal, a third drain terminal, and a third source terminal coupled to the second drain terminal. The select gate transistor, the following gate transistor, and the antifuse varactor are formed on a substrate structure.

17 Claims, 23 Drawing Sheets

Related U.S. Application Data

(60) Provisional application No. 61/823,928, filed on May 16, 2013.

(51) Int. Cl.
*G11C 17/16* (2006.01)
*H01L 29/78* (2006.01)
*H01L 27/10* (2006.01)
*G11C 17/18* (2006.01)
*H01L 23/525* (2006.01)

(52) U.S. Cl.
CPC .... H01L 27/11286 (2013.01); H01L 29/7833 (2013.01); *G11C 17/18* (2013.01); *H01L 23/5252* (2013.01); *H01L 2924/0002* (2013.01)

(56) References Cited

U.S. PATENT DOCUMENTS

| | | |
|---|---|---|
| 8,681,528 B2 | 3/2014 | Wu |
| 9,281,074 B2 * | 3/2016 | Wu .................. H01L 27/11206 |
| 2006/0203591 A1 * | 9/2006 | Lee ....................... G11C 17/16 |
| | | 365/225.7 |
| 2006/0221698 A1 | 10/2006 | Obuchi |
| 2006/0291267 A1 | 12/2006 | Jenne et al. |
| 2008/0042234 A1 | 2/2008 | Yamaguchi |
| 2009/0237975 A1 | 9/2009 | Schmitt et al. |
| 2009/0262565 A1 | 10/2009 | Shin |
| 2009/0267160 A1 | 10/2009 | Ichise |
| 2010/0038748 A1 | 2/2010 | Yamaguchi |
| 2011/0108923 A1 | 5/2011 | Kubota |

FOREIGN PATENT DOCUMENTS

| | | |
|---|---|---|
| EP | 1 895 543 A2 | 3/2008 |
| JP | 2006245177 A | 9/2006 |
| JP | 200847248 A | 2/2008 |
| JP | 2009259385 A | 11/2009 |
| JP | 2009267229 A | 11/2009 |
| JP | 2010147072 A | 7/2010 |
| JP | 2011119640 A | 6/2011 |
| TW | 201001427 A1 | 1/2010 |

* cited by examiner

ONE-TIME PROGRAMMABLE MEMORY CELL CAPABLE OF REDUCING LEAKAGE CURRENT AND PREVENTING SLOW BIT RESPONSE, AND METHOD FOR PROGRAMMING A MEMORY ARRAY COMPRISING THE SAME

CROSS REFERENCE TO RELATED APPLICATIONS

This is a continuation-in-part of U.S. application Ser. No. 14/222,684 (filed on Mar. 24, 2014), which claims the benefit of U.S. Provisional Application No. 61/823,928 (filed on May 16, 2013). The entire contents of the related applications are incorporated herein by reference.

BACKGROUND OF THE INVENTION

1. Field of the Invention

The present invention relates to a one time programmable (OTP) memory cell, and more particularly, to a one time programmable memory cell capable of reducing current leakage.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory. As shown in FIG. 1, a conventional OTP memory cell 100 comprises a transistor 110 and an antifuse transistor 120. When programming the OTP memory cell 100, the antifuse transistor 120 is ruptured and behaves as a MOS capacitor, such that data of logic "1" is written into the OTP memory 100.

Please refer to FIG. 2 and FIG. 3 together. FIG. 2 is a diagram showing a good rupture status of the OTP memory cell of FIG. 1 after programming. FIG. 3 is a diagram showing a bad rupture status of the OTP memory cell of FIG. 1 after programming. As showing in FIG. 2, when a gate oxide layer Ox corresponding to a gate terminal G of the antifuse transistor 120 is ruptured near a source terminal S of the antifuse transistor 120, leakage current between the gate terminal G and the source terminal S is smaller. As showing in FIG. 3, when the gate oxide layer Ox corresponding to the gate terminal G of the antifuse transistor is ruptured near a channel area of the antifuse transistor 120, leakage current between the gate terminal G and the source terminal S is larger, since more current can escape through the channel area.

However, in the prior art, it is difficult to control rupture position of the gate oxide layer Ox, such that the OTP memory cell 100 of the prior art may work incorrectly or has slow bit response due to insufficient power caused by the leakage current.

SUMMARY OF THE INVENTION

The present invention provides a one time programmable (OTP) memory cell comprising a select gate transistor, a following gate transistor, and an antifuse varactor. The select gate transistor has a first gate terminal, a first drain terminal, and a first source terminal. The following gate transistor has a second gate terminal, a second drain terminal, and a second source terminal coupled to the first drain terminal. The antifuse varactor has a third gate terminal, a third drain terminal, and a third source terminal coupled to the second drain terminal. The select gate transistor, the following gate transistor, and the antifuse varactor are formed on the substrate structure.

The present invention provides another one time programmable (OTP) memory cell comprising a select gate transistor, a following gate transistor, and an antifuse varactor. The select gate transistor has a first gate terminal, a first drain terminal, and a first source terminal. The following gate transistor has a second gate terminal, a second drain terminal, and a second source terminal coupled to the first drain terminal. The antifuse varactor has a third gate terminal, and a third source terminal coupled to the second drain terminal. A part of the third gate terminal is formed right above a shallow trench insulation area. The select gate transistor, the following gate transistor, and the antifuse varactor are formed on the substrate structure.

The present invention provides a further one time programmable (OTP) memory cell comprising a substrate structure, a select gate transistor, a following gate transistor, an antifuse varactor and a dummy transistor. The select gate transistor is formed on the substrate structure and has a first gate terminal, a first drain terminal, and a first source terminal. The following gate transistor is formed on the substrate structure and has a second gate terminal, a second drain terminal, and a second source terminal coupled to the first drain terminal. The antifuse varactor is formed on the substrate structure and has a third gate terminal, a third drain terminal, and a third source terminal coupled to the second drain terminal. The dummy transistor is partially formed on the substrate structure and has a fourth gate terminal, and a fourth source terminal coupled to the third drain terminal. Apart of the fourth gate terminal is formed right above a shallow trench insulation area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
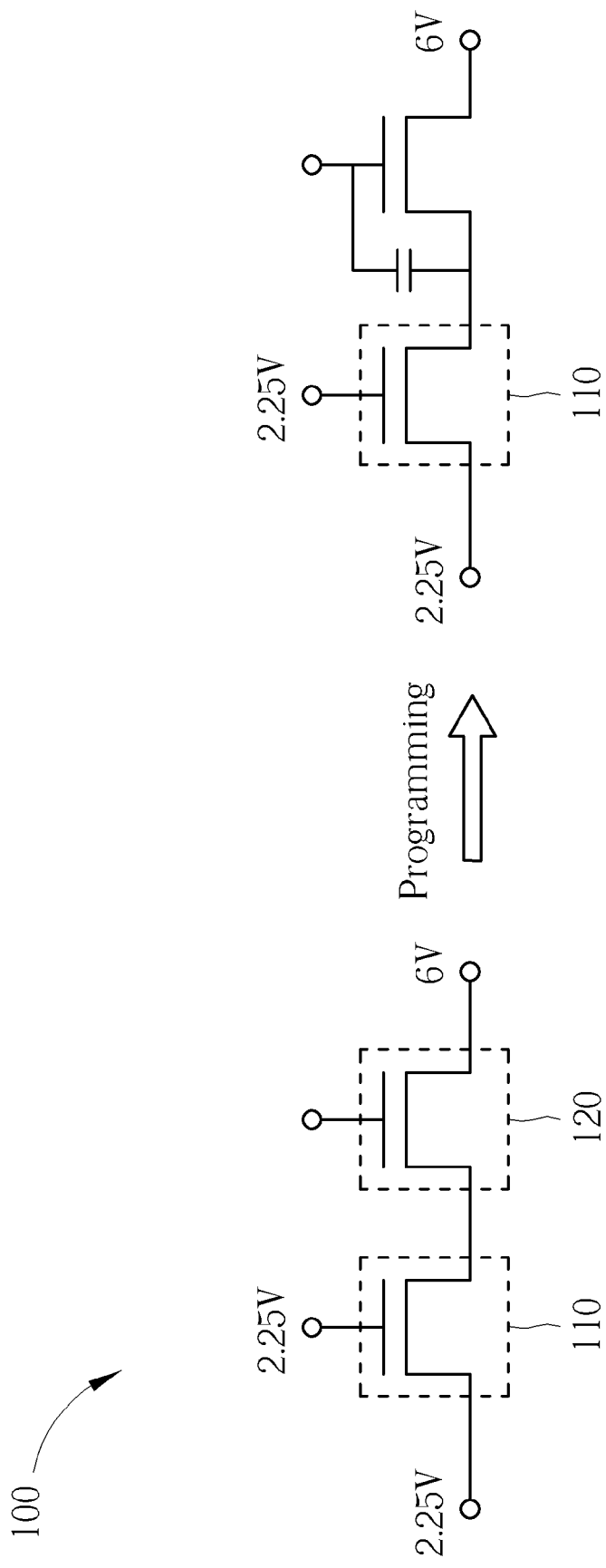
FIG. 1 is a diagram showing an equivalent circuit of a conventional OTP memory cell.
Figure 2:
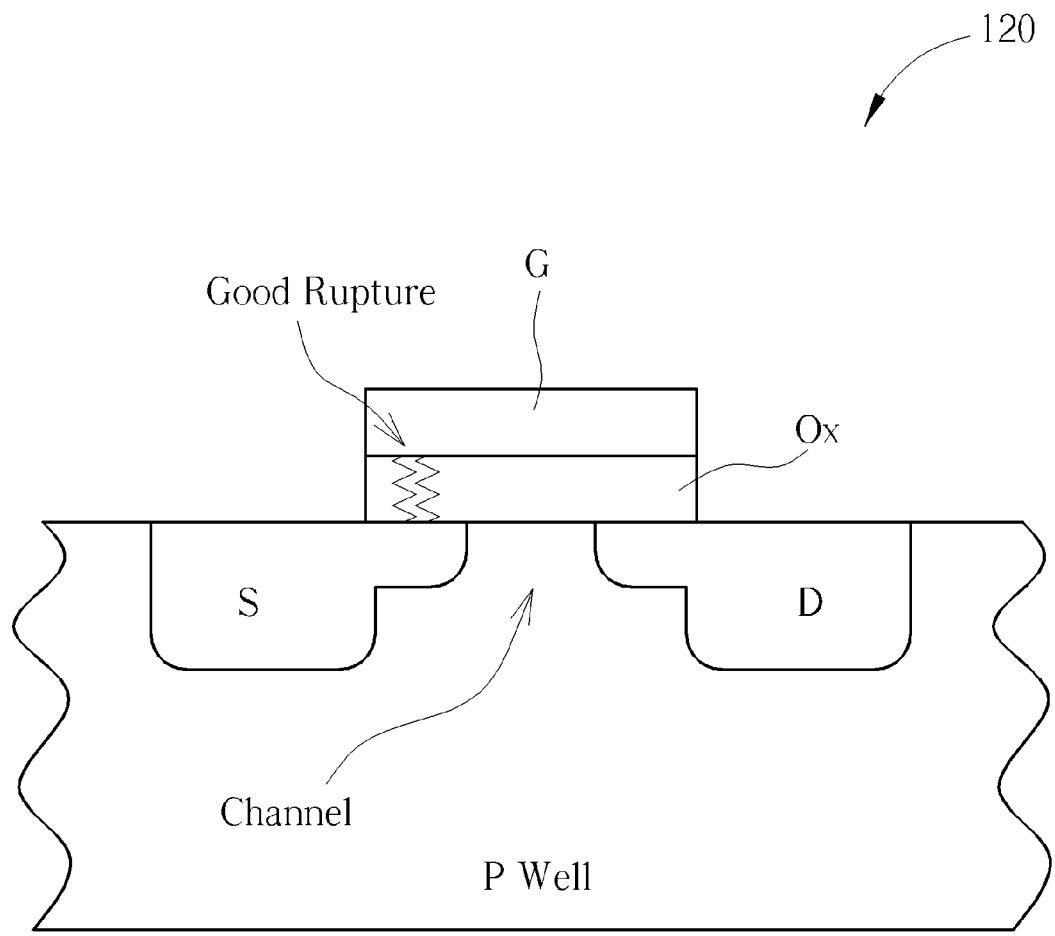
FIG. 2 is a diagram showing a good rupture status of the OTP memory cell of FIG. 1 after programming.
Figure 3:
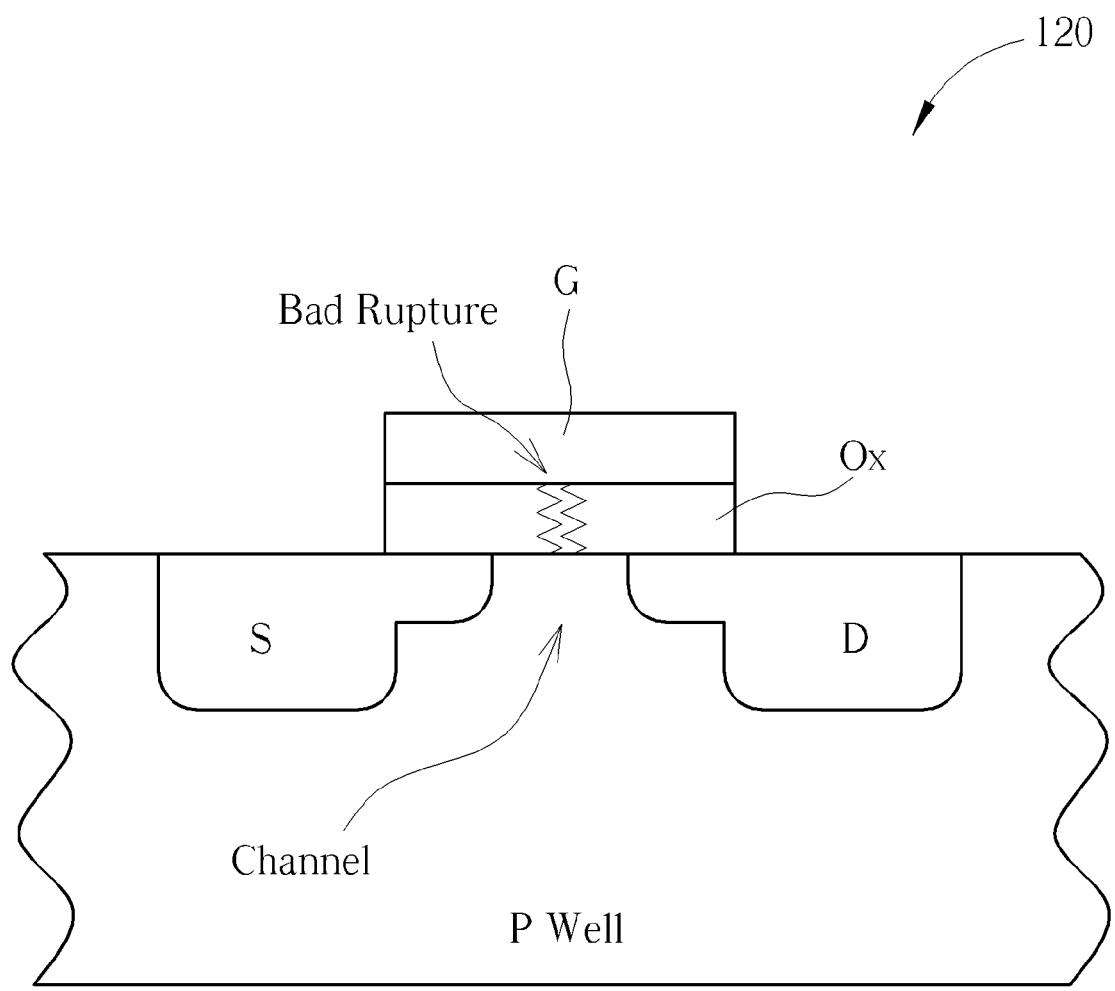
FIG. 3 is a diagram showing a bad rupture status of the OTP memory cell of FIG. 1 after programming.
Figure 4:
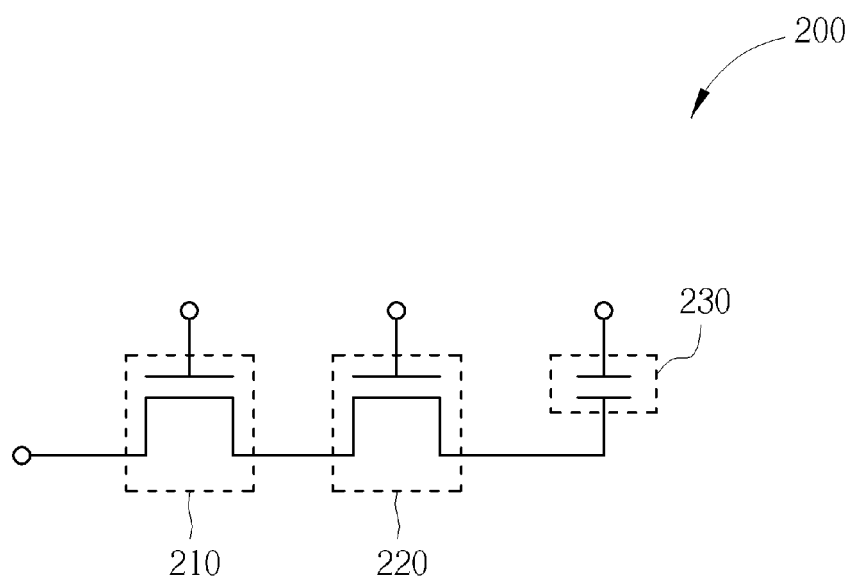
FIG. 4 is a diagram showing an equivalent circuit of an one time programmable (OTP) memory cell of the present invention.
Figure 5:
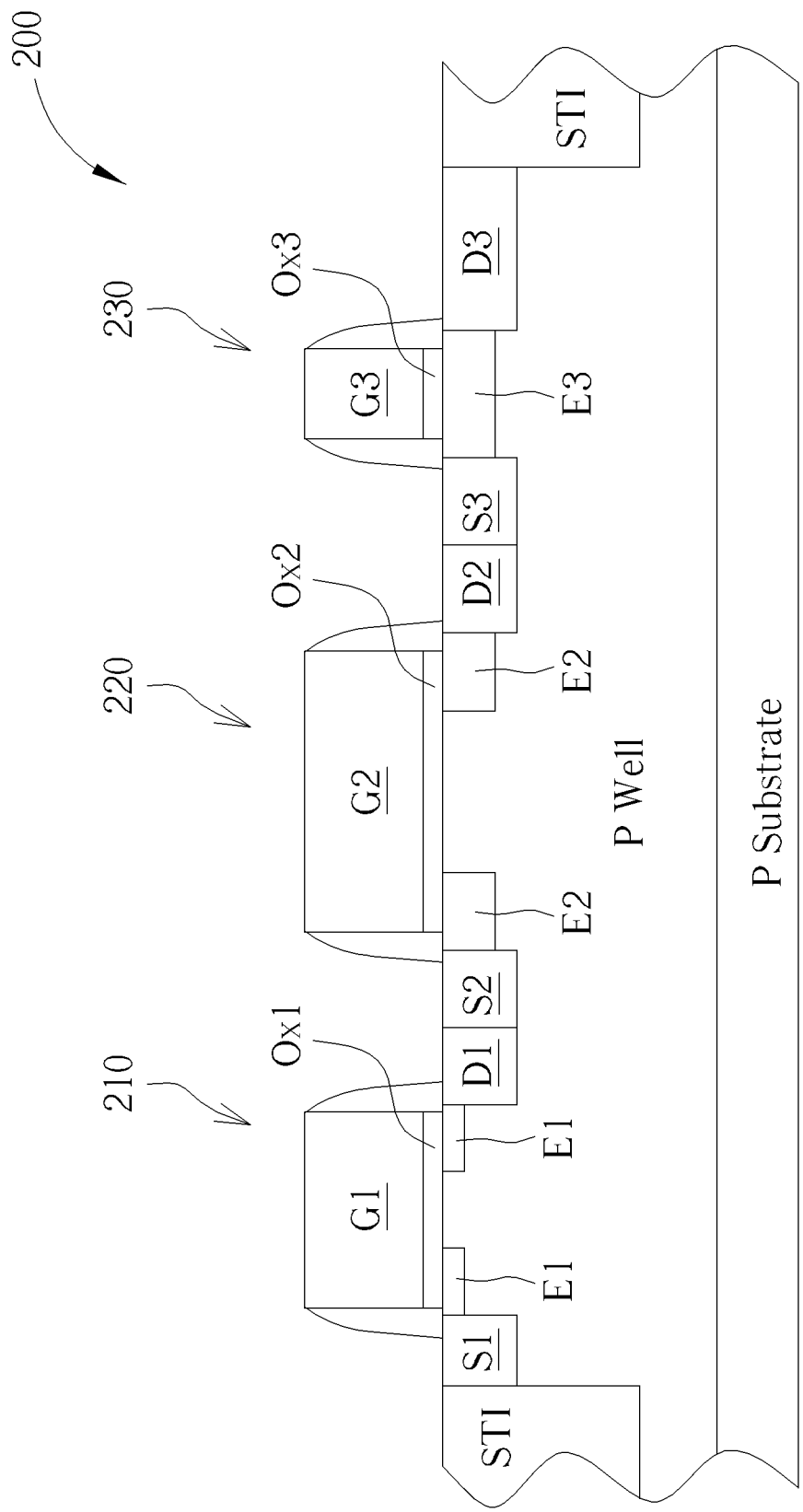
FIG. 5 is a diagram showing a structure of the OTP memory cell according to a first embodiment of the present invention.

Please refer to FIG. 4 and FIG. 5 together. FIG. 4 is a diagram showing an equivalent circuit of a one time programmable (OTP) memory cell of the present invention. FIG. 5 is a diagram showing a structure of the OTP memory cell according to a first embodiment of the present invention. As shown in the figures, the OTP memory cell 200 comprises a select gate transistor 210, a following gate transistor 220 and an antifuse varactor 230.

The select gate transistor 210 has a first gate terminal G1, a first drain terminal D1, a first source terminal S1, and two first source/drain extension areas E1 respectively coupled to the first drain terminal D1 and the first source terminal S1. The following gate transistor 220 has a second gate terminal G2, a second drain terminal D2, a second source terminal S2 coupled to the first drain terminal D1, and two second source/drain extension areas E2 respectively coupled to the second drain terminal D2 and the second source terminal S2. The antifuse varactor 230 can be a MOS varactor, and has a third gate terminal G3, a third drain terminal D3, a third source terminal S3 coupled to the second drain terminal D2, and a third source/drain extension area E3 coupled with the third drain terminal D3 and the third source terminal S3 for shorting the third drain terminal D3 and the third source terminal S3.

According to the above arrangement, since the third gate terminal G3 is formed right above the third source/drain extension area E3, and horizontal edges of the third gate terminal G3 are within horizontal edges of the third source/drain extension area E3, thus the antifuse varactor 230 has no channel. Therefore, when programming the OTP memory cell 200, the gate oxide layer Ox3 of the antifuse varactor 230 is ensured to be ruptured on the third source/drain extension area E3, so as to reduce possibility of current escaping through the channel. As a result, the OTP memory cell 200 of the present invention is capable of reducing leakage current, such that problems of slow bit response or malfunction can be prevented. Moreover, the series-connected following gate transistor 220 can reduce junction leakage in a program inhibit status.

In addition, each of the first source/drain extension areas E1 has a first depth, and each of the second and third source/drain extension areas E2, E3 has a second depth deeper than the first depth. For example, the first source/drain extension areas E1 can be source/drain extension areas for core devices, and the second and third source/drain extension areas E2, E3 can be source/drain extension areas for I/O devices, such that PN junction breakdown of the following gate transistor 220 can be prevented. Furthermore, the second source/drain extension area E2 can be asymmetric thus drain side extension is deeper than source side extension. For example, the second source extension of following gate transistor can be depth of core device and second drain extension can be depth of I/O device separately. Besides, gate oxide layers Ox1-Ox3 of the first to third gate terminals G1-G3 are for core devices, thus the gate oxide layers Ox1-Ox3 of the first to third gate terminals G1-G3 are thinner than gate oxide layers for I/O devices.

Figure 6:
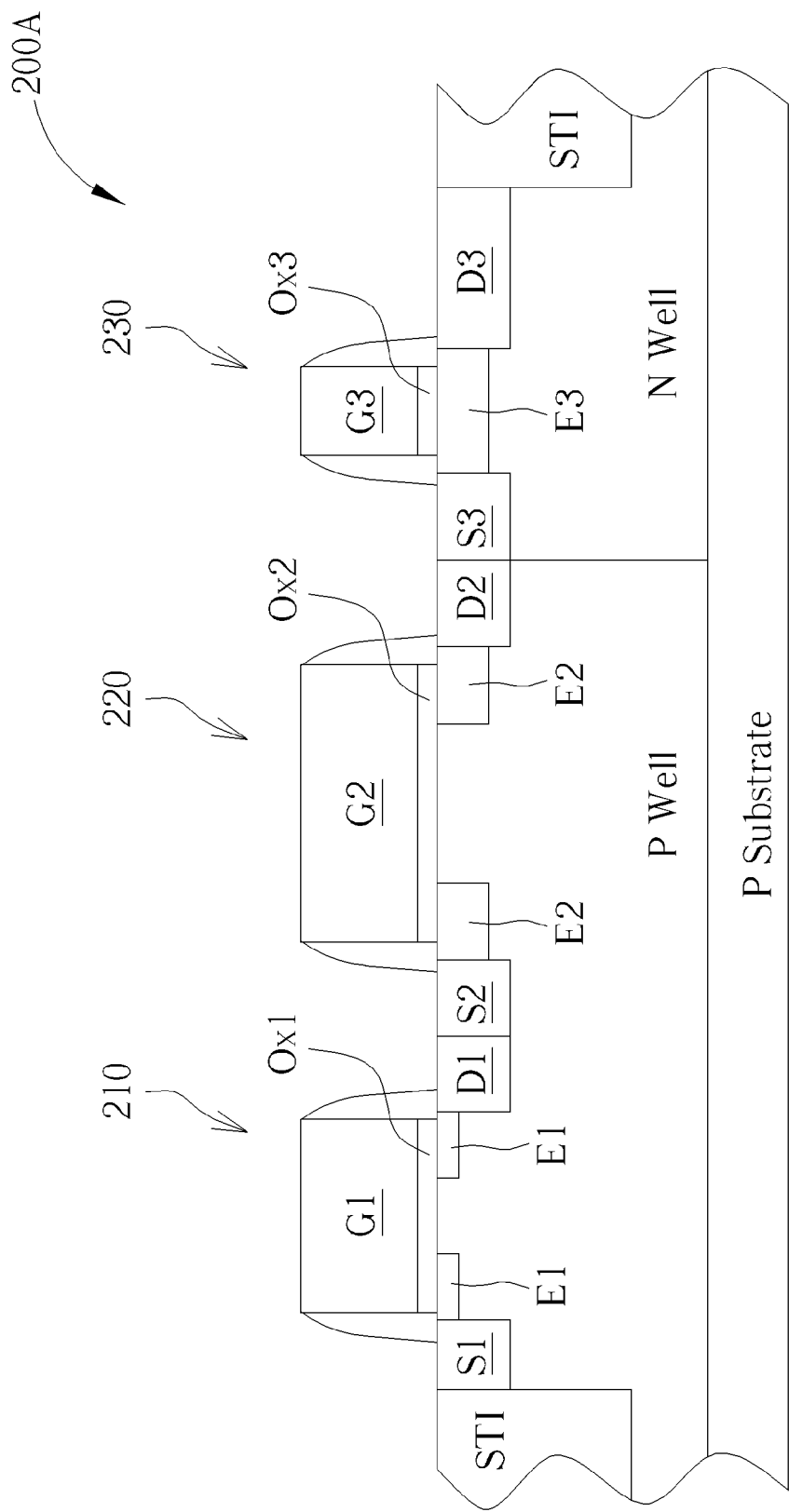
FIG. 6 is a diagram showing a structure of the OTP memory cell according to a second embodiment of the present invention.

Please refer to FIG. 6. FIG. 6 is a diagram showing a structure of the OTP memory cell according to a second embodiment of the present invention. Most features of the OTP memory cell 200A are identical to the OTP memory cell 200 of FIG. 5. As shown in FIG. 6, different from the OTP memory cell 200 of FIG. 5 all forming on a P well, the OTP memory cell 200A of FIG. 6 has the select gate transistor 210 and the following gate transistor 220 forming on a P well, and the antifuse varactor 230 forming on an N well. In addition, in the embodiment of FIG. 6, the third source/drain extension area E3 is not necessary, that is, the third source/drain extension area E3 can either exist, or be removed and replaced by the N well.

Figure 7:
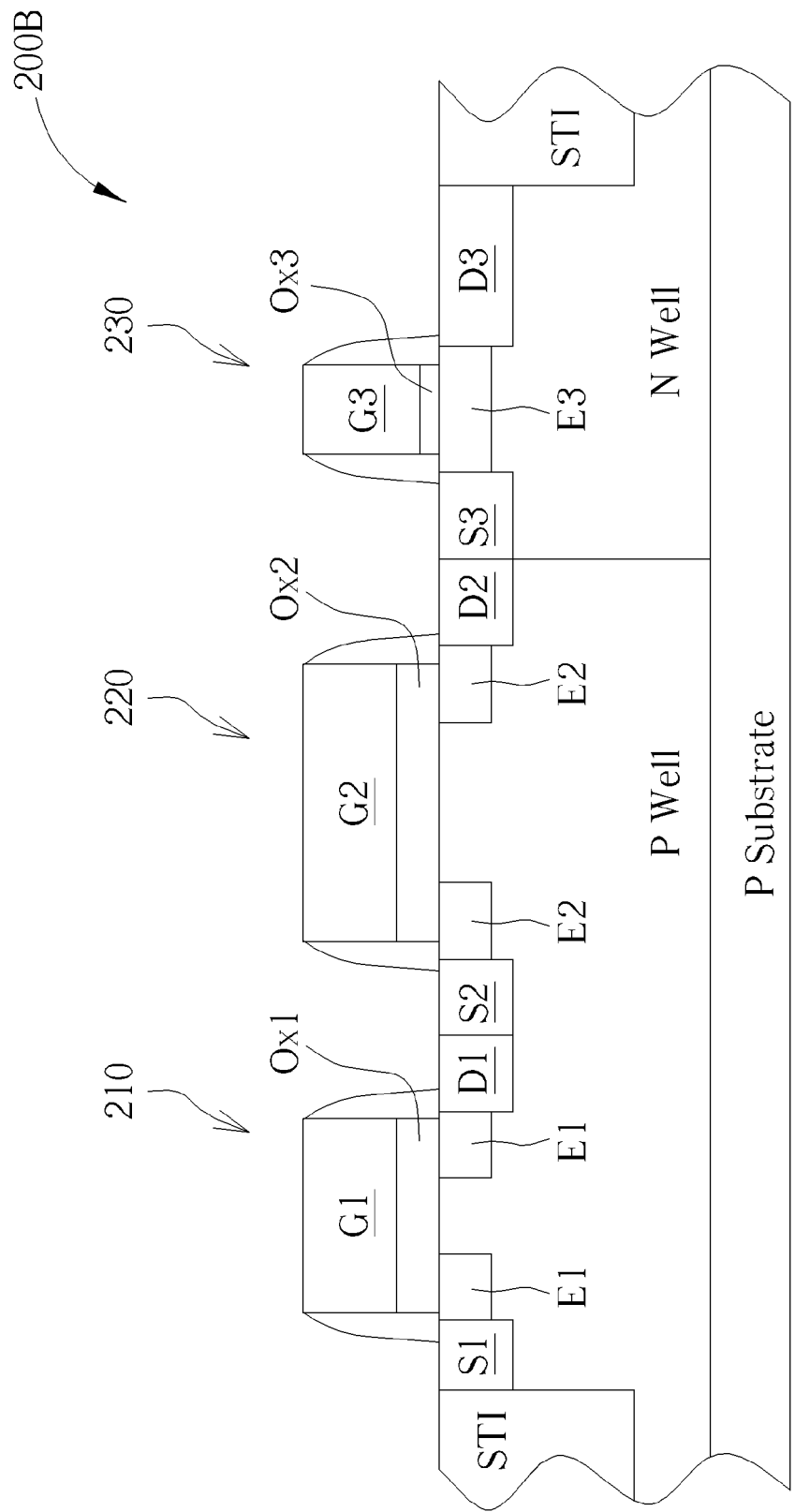
FIG. 7 is a diagram showing a structure of the OTP memory cell according to a third embodiment of the present invention.

Please refer to FIG. 7. FIG. 7 is a diagram showing a structure of the OTP memory cell according to a third embodiment of the present invention. Most features of the OTP memory cell 200B are identical to the OTP memory cell 200A of FIG. 6. As shown in FIG. 7, different from the OTP memory cell 200A of FIG. 6 having gate oxide layers Ox1-Ox3 with a same thickness, the OTP memory cell 200B of FIG. 7 has the gate oxide layers Ox1, Ox2 of the select gate transistor 210 and the following gate transistor 220 with a larger thickness, and the gate oxide layer Ox3 of the antifuse varactor 230 with a smaller thickness. For example, the gate oxide layers Ox1, Ox2 of the select gate transistor 210 and the following gate transistor 220 are for I/O devices, and the gate oxide layer Ox3 of the antifuse varactor 230 is for core devices. Besides, the first source/drain extension areas E1 are formed as deep as the second and third source/drain extension areas E2, E3, that is, the first source/drain extension areas E1 can also be source/drain extension areas for I/O devices.

Figure 8:
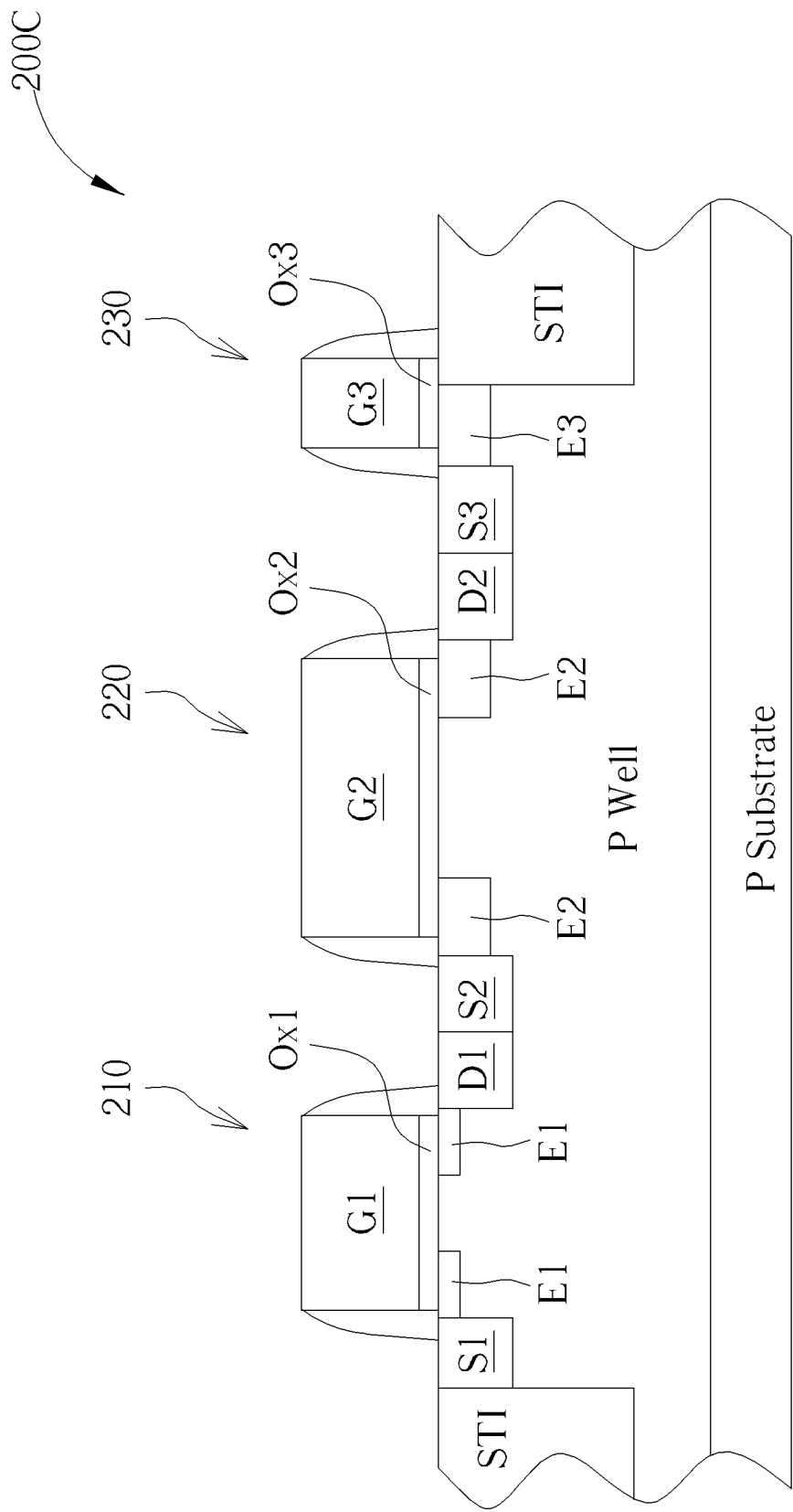
FIG. 8 is a diagram showing a structure of the OTP memory cell according to a fourth embodiment of the present invention.

Please refer to FIG. 8. FIG. 8 is a diagram showing a structure of the OTP memory cell according to a fourth embodiment of the present invention. The select gate transistor 210 and the following gate transistor 220 are identical to those of FIG. 5. As shown in FIG. 8, different from the antifuse varactor 230 of FIG. 5, the drain terminal of the antifuse varactor 230' is replaced by a shallow trench insulation area STI, such that a part of the third gate terminal G3 is formed right above the shallow trench insulation area STI, and rest of the third gate terminal G3 is formed right above the third source/drain extension area E3. According to the above arrangement, the antifuse varactor 230' has no channel, therefore, when programming the OTP memory cell 200C, the gate oxide layer Ox3 of the antifuse varactor 230' is ensured to be ruptured on the third source/drain extension area E3, which is close to the third source terminal S3, so as to reduce possibility of current escaping through the channel.

Figure 9:
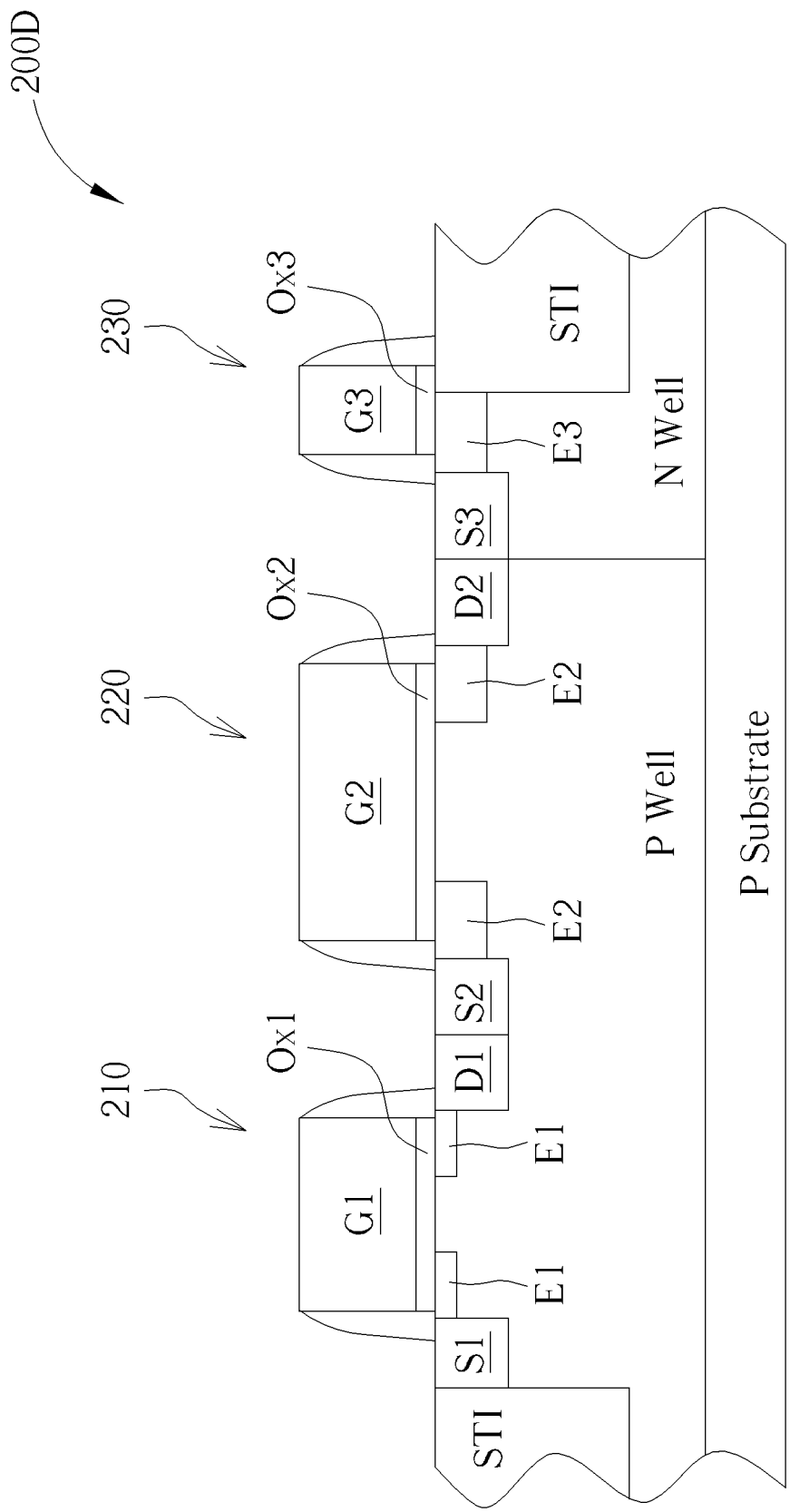
FIG. 9 is a diagram showing a structure of the OTP memory cell according to a fifth embodiment of the present invention.

Please refer to FIG. 9. FIG. 9 is a diagram showing a structure of the OTP memory cell according to a fifth embodiment of the present invention. Most features of the OTP memory cell 200D are identical to the OTP memory cell 200C of FIG. 8. As shown in FIG. 9, different from the OTP memory cell 200C of FIG. 8 all forming on a P well, the OTP memory cell 200D of FIG. 9 has the select gate transistor 210 and the following gate transistor 220 forming on a P well, and the antifuse varactor 230' forming on an N well. In addition, in the embodiment of FIG. 9, the third source/drain extension area E3 is not necessary, that is, the third source/drain extension area E3 can either exist, or be removed and replaced by the N well.

Figure 10:
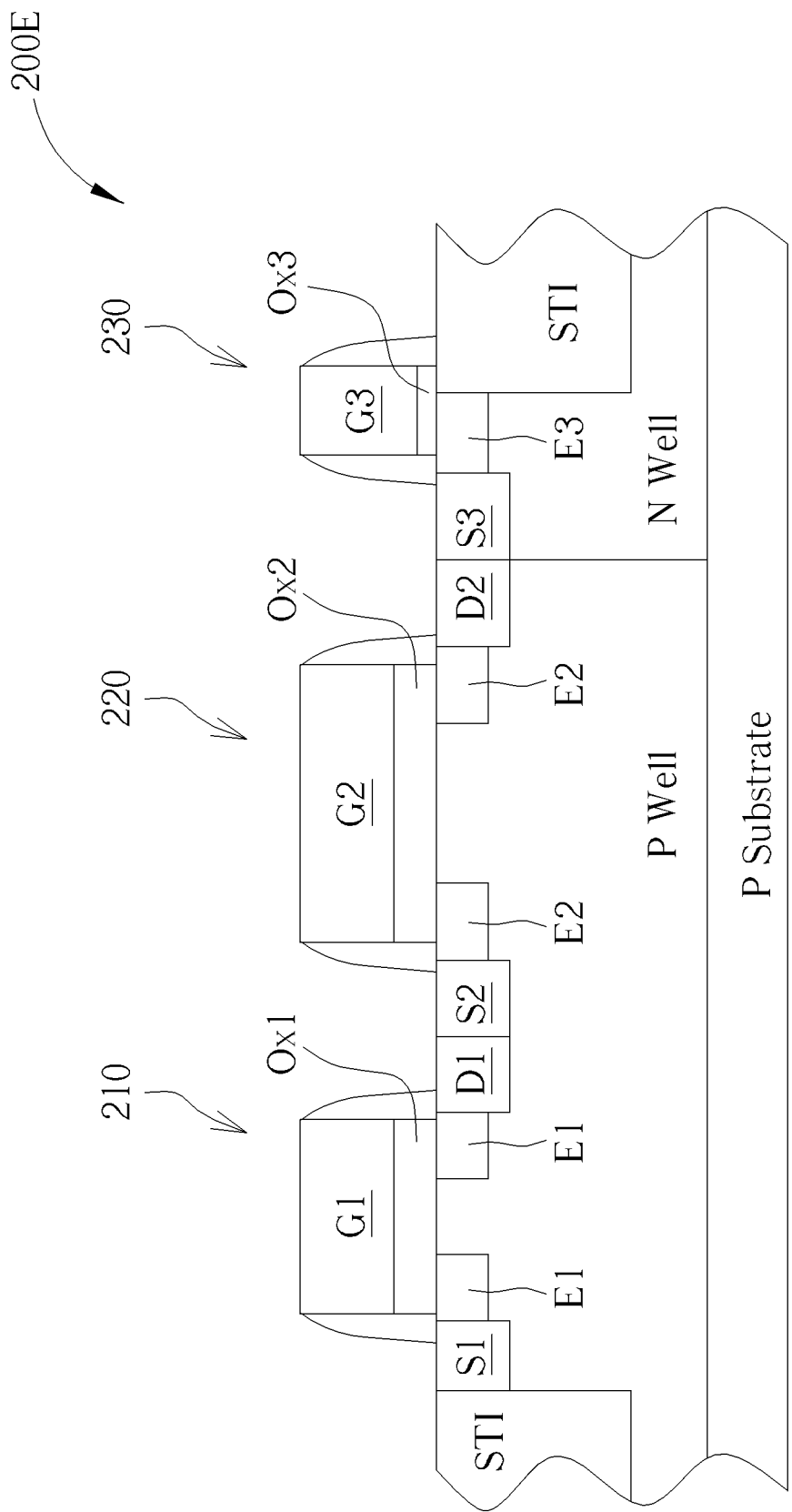
FIG. 10 is a diagram showing a structure of the OTP memory cell according to a sixth embodiment of the present invention.

Please refer to FIG. 10. FIG. 10 is a diagram showing a structure of the OTP memory cell according to a sixth embodiment of the present invention. Most features of the OTP memory cell 200E are identical to the OTP memory cell 200D of FIG. 9. As shown in FIG. 10, different from the OTP memory cell 200D of FIG. 9 having gate oxide layers Ox1-Ox3 with a same thickness, the OTP memory cell of FIG. 10 has the gate oxide layers Ox1, Ox2 of the select gate transistor 210 and the following gate transistor 220 with a larger thickness, and the gate oxide layer Ox3 of the antifuse varactor 230' with a smaller thickness. For example, the gate oxide layers Ox1, Ox2 of the select gate transistor 210 and the following gate transistor 220 are for I/O devices, and the gate oxide layer Ox3 of the antifuse varactor 230' is for core devices. Besides, the first source/drain extension areas E1 are formed as deep as the second and third source/drain extension areas E2, E3, that is, the first source/drain extension areas E1 can also be source/drain extension areas for I/O devices.

In the above embodiments, the first drain terminal D1 and the second source terminal S2 are integrated as a single terminal, and the second drain terminal D2 and the third source terminal S3 are also integrated as a single terminal, but in other embodiments of the present invention, the first drain terminal D1, the second source terminal S2, the second drain terminal D2, and the third source terminal S3 cab be separated from each other as independent terminals.

Figure 11:
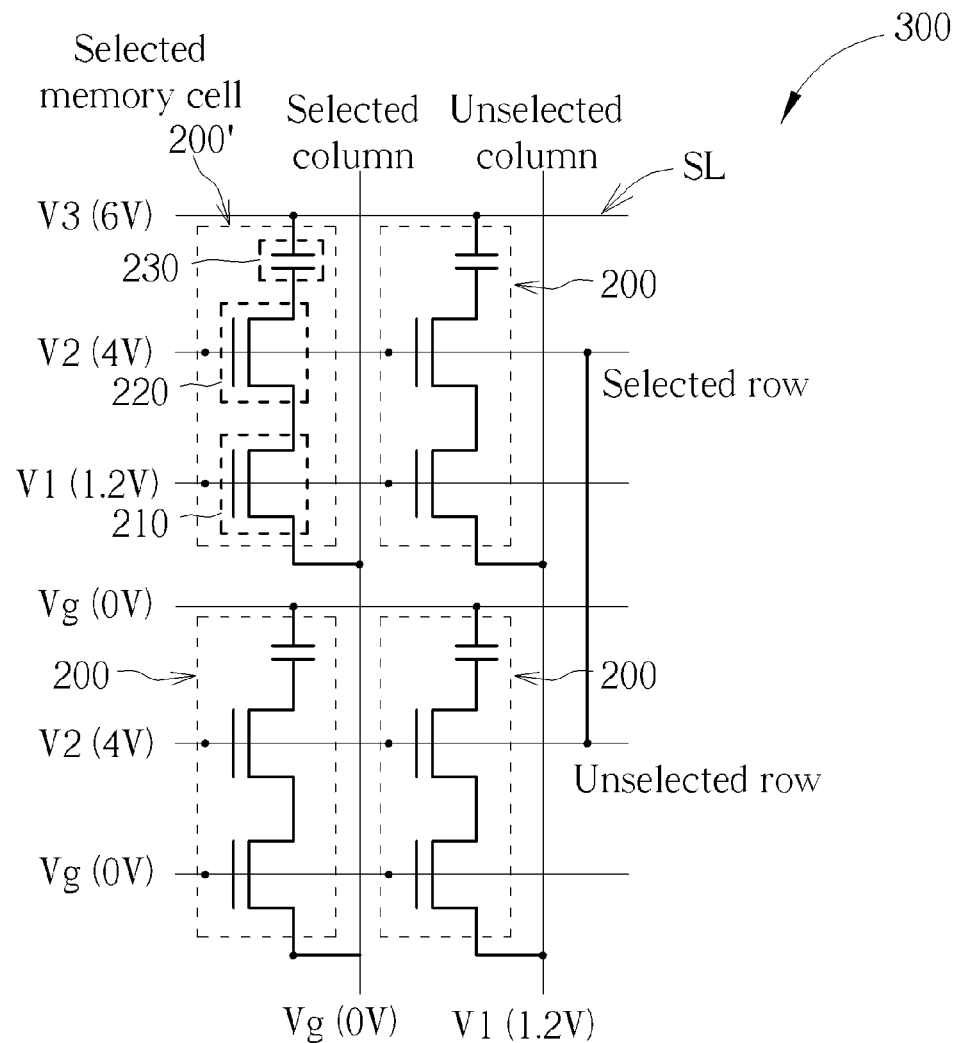
FIG. 11 is a diagram showing a method for programming a memory array comprising the OTP memory cells of the present invention.

Please refer to FIG. 11. FIG. 11 is a diagram showing a method for programming a memory array comprising the OTP memory cells of the present invention. As shown in FIG. 11, when programming the memory array 300 comprising a plurality of OTP memory cells 200, 200' of the present invention, a first voltage V1 (such as 1.2V) is provided to the first gate terminals of the OTP memory cells at a selected row, a second voltage V2 (such as 4V) is provided to all of the second gate terminals of the memory array 300, and a third voltage V3 (such as 6V) is provided to the third gate terminals of the selected memory cell 200'. Besides, a ground voltage Vg (such as 0V) is provided to the first source terminals of a selected column via a bit line BL.

According to the above arrangement, the antifuse varactor 230 of the selected memory cell 200' can be ruptured to be a resistor by the third voltage V3, such that data of logic "1" is written into the selected OTP memory cell 200' at the selected row and selected column. On the other hand, for writing data of logic "0" into the selected OTP memory cell 200' at the selected row and column, the voltage level at the third gate terminal can be set at 0V.

In addition, in FIG. 11, for the unselected OTP memory cell 200 at the unselected row and selected column, the ground voltage Vg is provided to the first and third gate terminals of the unselected row; for the unselected OTP memory cell 200 at the selected row and unselected column, the first voltage V1 is provided to the first source terminal of the OTP memory cell at the unselected column; and for the unselected OTP memory cells 200 at the unselected row and unselected column, the ground voltage Vg is provided to the first and third gate terminals of the OTP memory cell, and the first voltage V1 is provided to the first source terminals of the OTP memory cell. Therefore, the unselected OTP memory cells 200 at the unselected row and/or unselected column can be set in a program inhibition status.

Figure 12:
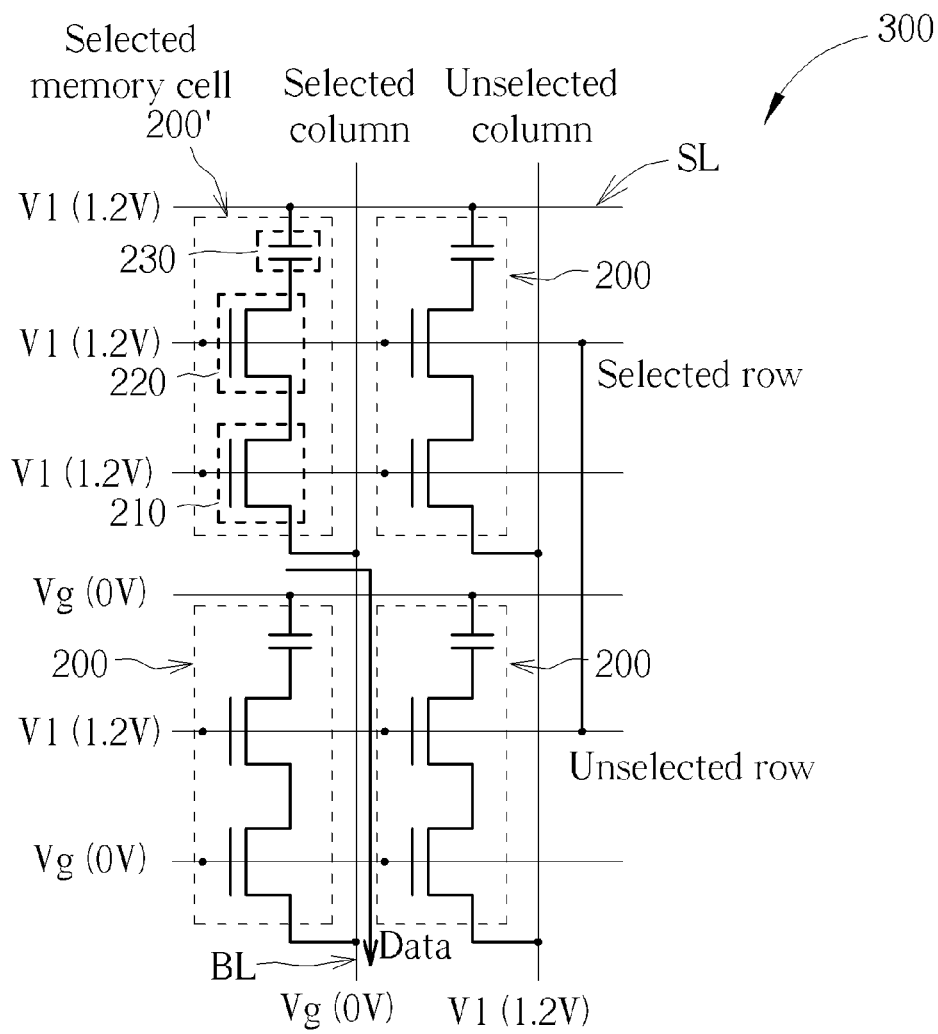
FIG. 12 is a diagram showing a method for reading a memory array comprising the OTP memory cells of the present invention.

Please refer to FIG. 12. FIG. 12 is a diagram showing a method for reading a memory array 300 comprising the OTP memory cells of the present invention. As shown in FIG. 12, when reading data from the memory array 300, a first voltage V1 (such as 1.2V) is provided to the first and third gate terminals of the OTP memory cells at the selected row, and the first voltage V1 is also provided to all of the second gate terminals of the memory array 300. Besides, a ground voltage Vg (such as 0V) is provided to the first source terminals of the OTP memory cells at a selected column.

According to the above arrangement, data stored in a selected OTP memory cell 200' at the selected row and column can be read via a bit line BL coupled to the first source terminals of the selected column.

In addition, in FIG. 12, for the unselected OTP memory cell 200 at the unselected row and selected column, the ground voltage Vg is provided to the first and third gate terminals of the OTP memory cells at the unselected row; for the unselected OTP memory cell 200 at the selected row and unselected column, the first voltage V1 is provided to the first source terminal of the OTP memory cell at the unselected column; and for the unselected OTP memory cell 200 at the unselected row and unselected column, the ground voltage Vg is provided to the first and third gate terminals of the OTP memory cell, and the first voltage V1 is provided to the first source terminal of the OTP memory cell. Therefore, the unselected OTP memory cells 200 at the unselected row and/or unselected column can be set in a read inhibition status.

In the embodiment of FIG. 12, the OTP memory cell 200, 200' is illustrated by the OTP memory cell having the select gate transistor and the following gate transistor with oxide layers for core devices, however, the OTP memory cells 200, 200' of FIG. 12 can also be replaced by the OTP memory cell having the select gate transistor and the following gate transistor with oxide layers for I/O devices, in that case, the first voltage V1 can be set higher (such as 2.5V).

Figure 13:
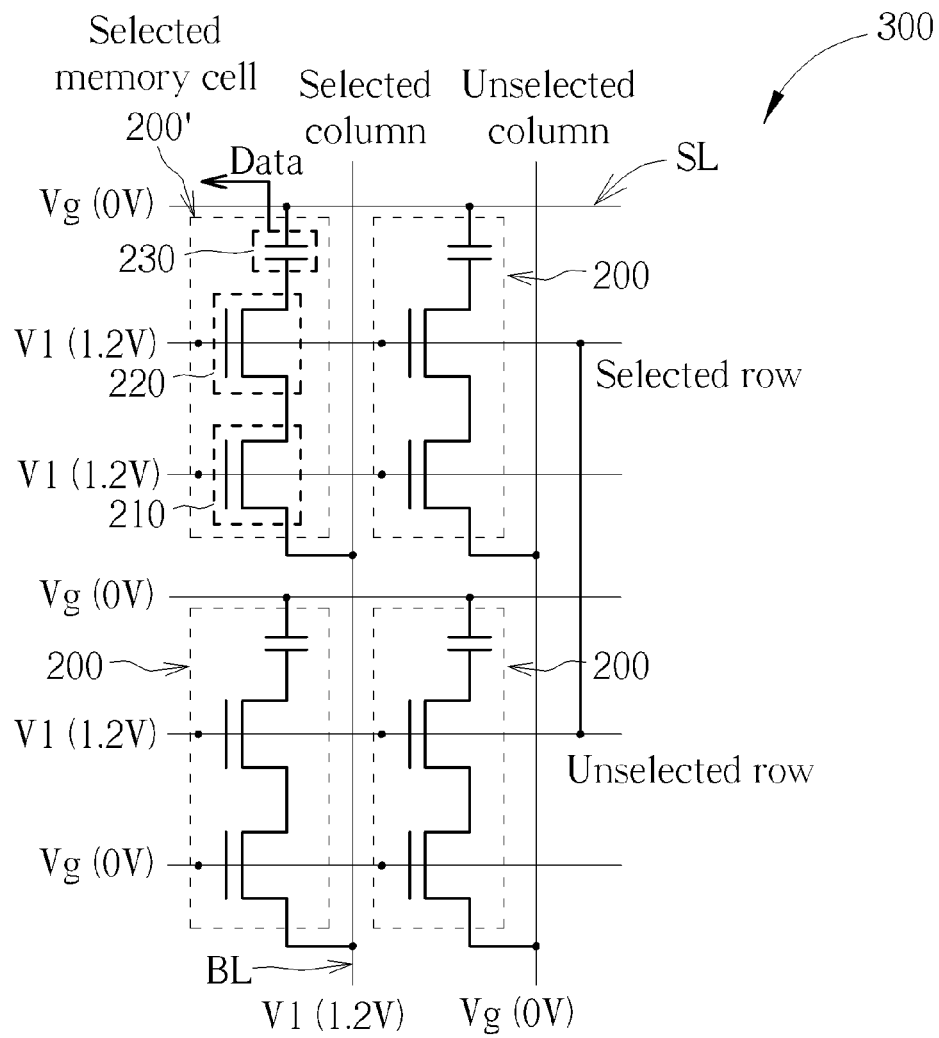
FIG. 13 is a diagram showing another method for reading a memory array comprising the OTP memory cells of the present invention.

Since the antifuse varactor 230 the OTP memory cell 200 has no channel, the memory array comprising the OTP memory cells of the present invention is able to perform a reverse read operation according to an operation bias condition different from the embodiment of FIG. 12. For example, please refer to FIG. 13. FIG. 13 is a diagram showing another method for reading a memory array comprising the OTP memory cells of the present invention. As shown in FIG. 13, when reading data from the memory array 300, a first voltage V1 (such as 1.2V) is provided to the first gate terminals of the OTP memory cells at the selected row, the first voltage V1 is also provided to all of the second gate terminals of the memory array 300, and a ground voltage Vg (such as 0V) is provided to all of the third gate terminals of the memory array 300. Besides, the first voltage V1 is also provided to the first source terminals of the OTP memory cells at a selected column via the bit line BL. The ground voltage Vg provided to the third gate terminal of the selected memory cell 200' works as a reverse read voltage. The reverse read voltage is not necessary to be set at a ground level, the reverse read voltage can be set at other voltage level lower than the first voltage V1.

According to the above arrangement, data stored in a selected OTP memory cell 200' at the selected row and column can be read via a signal line SL coupled to the third gate terminals of the selected row. The reading direction of the selected OTP memory cell in FIG. 13 is opposite to the reading direction of the selected OTP memory cell in FIG. 12. Therefore, the selected OTP memory cell 200' can perform both forward reading operation (as shown in FIG. 12) and reverse reading operation (as shown in FIG. 13) smoothly, since the rupture position of the antifuse varactor 230 is ensured to be on the third source/drain extension area.

In addition, in FIG. 13, for the unselected OTP memory cell 200 at the unselected row and selected column, the ground voltage Vg is provided to the first gate terminal of the OTP memory cell at the unselected row; for the unselected OTP memory cell 200 at the selected row and unselected column, the ground voltage is provided to the first source terminal of the OTP memory cell at the unselected column; and for the unselected OTP memory cell 200 at the unselected row and unselected column, the ground voltage Vg is provided to the first gate terminal of the OTP memory cell, and the ground voltage Vg is also provided to the first source terminal of the OTP memory cell. Therefore, the unselected OTP memory cells 200 at the unselected row and/or unselected column can be set in a read inhibition status.

In the embodiments of FIG. 11 to FIG. 13, the OTP memory cell is illustrated by the OTP memory cell 200 according to the first embodiment of FIG. 5, however, the OTP memory cells of FIG. 11 to FIG. 13 can also be replaced by the OTP memory cell 200A-200E according to the second to sixth embodiments of the present invention. The voltage ranges shown in FIG. 11 to FIG. 13 are applicable to a memory array made in a 40 nm process, and the present invention is not limited by the above voltage ranges. In other embodiments of the present invention, the voltage ranges can be changed according to processes at different scales.

In contrast to the prior art, the OTP memory cell of the present invention can reduce current leakage of the OTP memory cell by utilizing a MOS varactor for storing data, such that problems of slow bit response and malfunction can be prevented. Furthermore, the following gate transistor provides unique advantages in this invention. During program operation, the second gate terminal is biased to higher voltage than first gate terminal. It can form a cascade series transistor to resist high voltage damage from third gate terminal when antifuse is ruptured. Also second drain extension that adopts deeper depth can improve PN junction breakdown at drain side of following gate transistor. Besides, the OTP memory cell of the present invention is capable of performing both forward reading operation and reverse reading operation, so as to improve efficiency for reading operation.

In some other embodiments of the present invention, transistors of the OTP memory cell may be formed by using fin field effect transistor device (FinFET). Gate structure of the FinFET is formed over a substrate structure. The substrate structure may be a p type substrate, an n type substrate, a deep n well over a p substrate or an n type barrier layer over a p substrate, and so forth. And, the source/drain terminals of the FinFET are elevated and formed on the substrate structure by an epitaxial silicon phosphorous (SiP) or silicon carbide (SiC) process.

Figure 14:
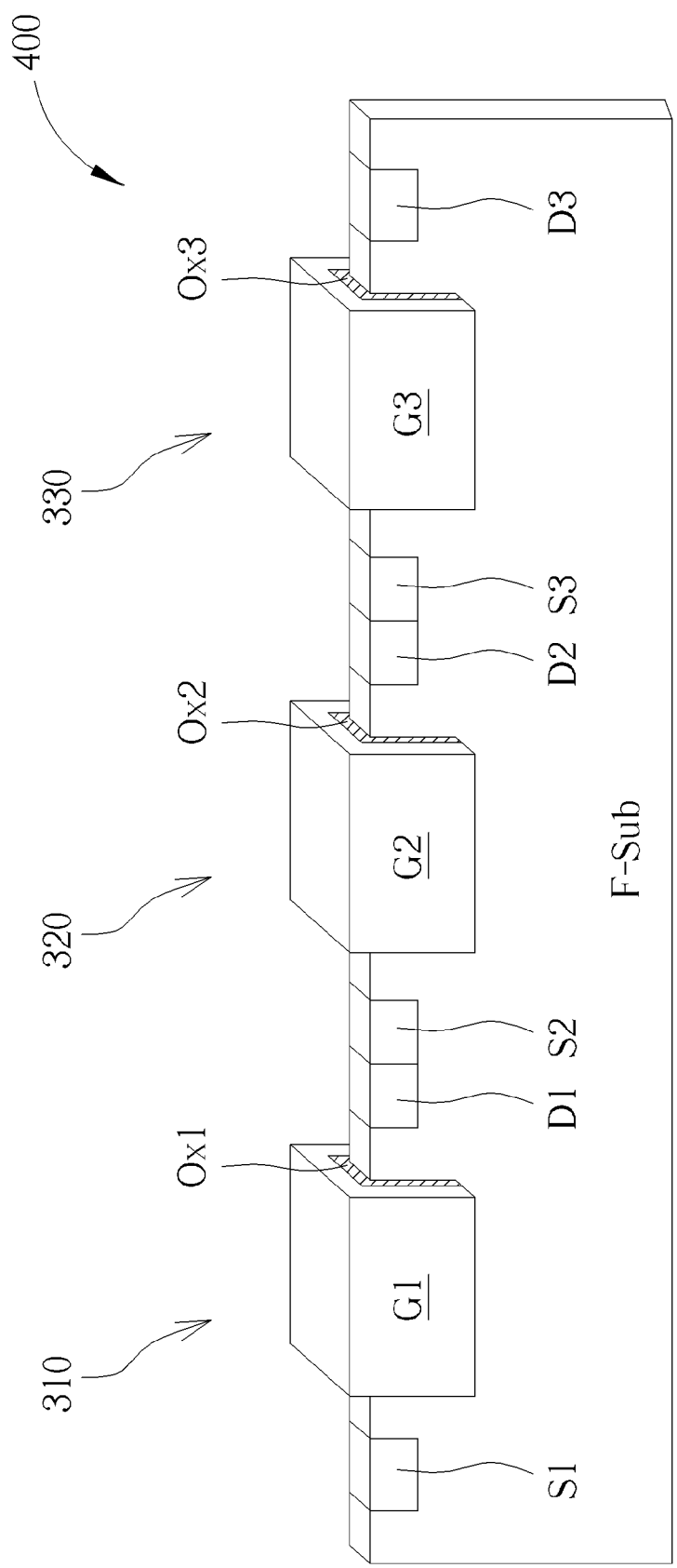
FIG. 14 is a diagram showing a structure of the OTP memory cell according to a seventh embodiment of the present invention.

FIG. 14 is a diagram showing a structure of the OTP memory cell 400 according to a seventh embodiment of the present invention. As shown in the figure, the OTP memory cell 400 includes a select gate transistor 310, a following gate transistor 320, and an antifuse varactor 330 formed on a substrate structure F-sub.

The select gate transistor 310 has a first gate terminal G1, a first drain terminal D1, and a first source terminal S1. The following gate transistor 320 has a second gate terminal G2, a second drain terminal D2, and a second source terminal S2 coupled to the first drain terminal D1. The antifuse varactor 330 can be a MOS varactor, and has a third gate terminal G3, a third drain terminal D3, and a third source terminal S3 coupled to the second drain terminal D2. In this embodiment, there are no source/drain extension areas formed in between any of the source terminals and drain terminals of the select gate transistor 310, the following gate transistor 320, and the antifuse varactor 330.

The first gate terminal G1, the second gate terminal G2, and the third gate terminal G3 may each be formed to have a U shape to overlap three lateral sides of the substrate structure F-sub. As shown in FIG. 14, in between each of the gate terminals G1-G3 and the substrate structure F-sub is a respective gate oxide layer Ox1-Ox3.

Although there is no source/drain extension area formed in between any of the source terminals and drain terminals of the select gate transistor 310, the following gate transistor 320, and the antifuse varactor 330, when programming the OTP memory cell 400, the gate oxide layer Ox3 of the antifuse varactor 330 may be ruptured and possibility of current escaping through the channel is reduced because of the use of fin field effect transistor device (FinFET). As a result, the OTP memory cell 400 of the present invention is capable of reducing leakage current, such that problems of slow bit response or malfunction can be prevented. Moreover, the series-connected following gate transistor 320 can reduce junction leakage in a program inhibition status.

Figure 15:
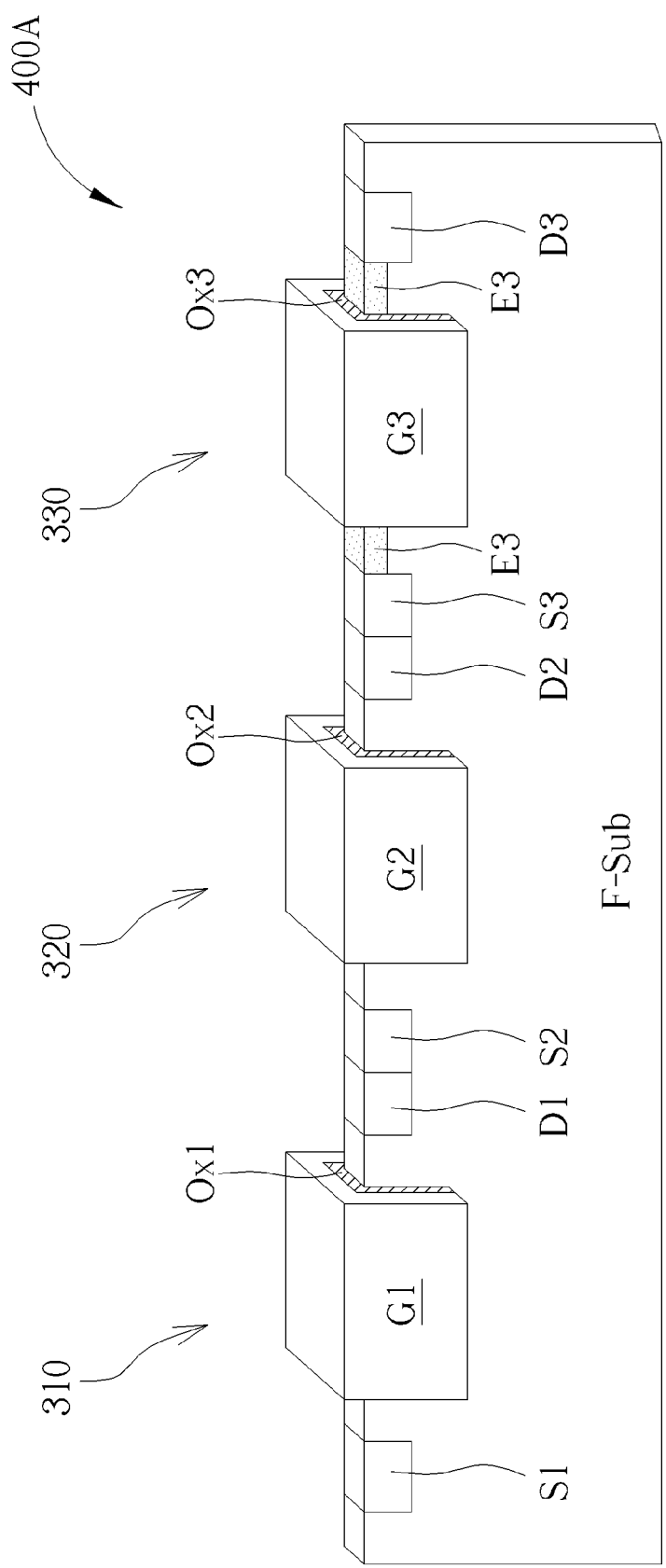
FIG. 15 is a diagram showing a structure of the OTP memory cell according to an eighth embodiment of the present invention.

FIG. 15 is a diagram showing a structure of the OTP memory cell 400A according to an eighth embodiment of the present invention. As shown in the figure, the OTP memory cell 400A includes a select gate transistor 310, a following gate transistor 320, and an antifuse varactor 330 formed on a substrate structure F-sub.

The select gate transistor 310 has a first gate terminal G1, a first drain terminal D1, and a first source terminal S1. The following gate transistor 320 has a second gate terminal G2, a second drain terminal D2, and a second source terminal S2 coupled to the first drain terminal D1. The antifuse varactor 330 can be a MOS varactor, and has a third gate terminal G3, a third drain terminal D3, a third source terminal S3 coupled to the second drain terminal D2, and a third source/drain extension area E3 coupled with the third drain terminal D3 and the third source terminal S3 for shorting the third drain terminal D3 and the third source terminal S3. In this embodiment, there are no source/drain extension areas formed in between any of the source terminals and drain terminals of the select grate transistor 310 and the following gate transistor 320.

Since the third source/drain extension area E3 is implanted into the substrate structure F-sub, it can be considered that the first gate terminal G1, the second gate terminal G2, and the third gate terminal G3 may each be formed to have a U shape to overlap three lateral sides of the substrate structure F-sub. As shown in FIG. 15, in between each of the gate terminals G1-G3 and the substrate structure F-sub is a respective gate oxide layer Ox1-Ox3. Further, although the third source/drain extension area E3 is used to couple with the third drain terminal D3 and the third source terminal S3, the present invention is not limited to the structure illustrated in FIG. 15. For example, in other embodiments, at least one source/drain extension area can be used to arbitrarily couple with a source terminal and/or a drain terminal corresponding to the select gate transistor 310 or the following gate transistor 320.

Figure 16:
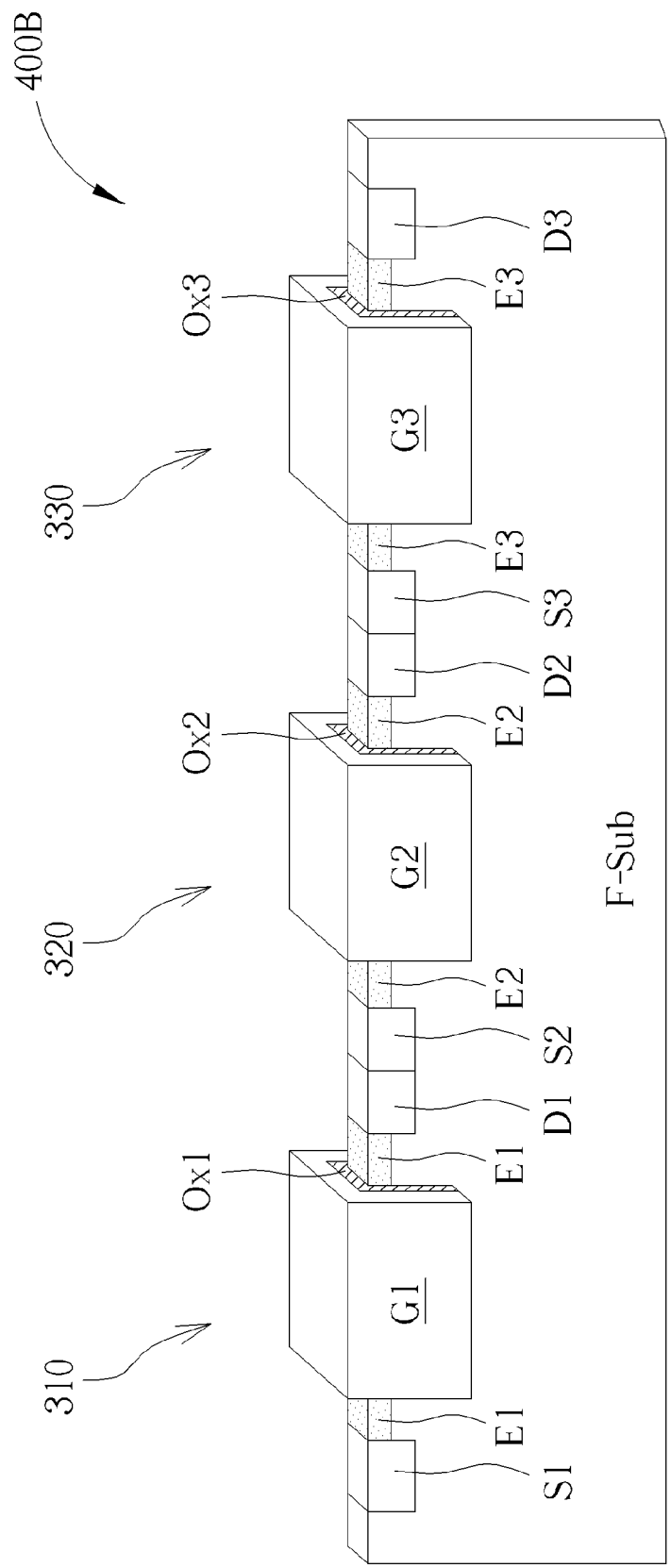
FIG. 16 is a diagram showing a structure of the OTP memory cell according to a ninth embodiment of the present invention.

FIG. 16 is a diagram showing a structure of the OTP memory cell 400B according to a ninth embodiment of the present invention. As shown in the figure, the OTP memory cell 400B includes a select gate transistor 310, a following gate transistor 320 and an antifuse varactor 330 formed on a substrate structure F-sub.

The select gate transistor 310 has a first gate terminal G1, a first drain terminal D1, a first source terminal S1, and two first source/drain extension areas E1 respectively coupled to the first drain terminal D1 and the first source terminal S1. The following gate transistor 320 has a second gate terminal G2, a second drain terminal D2, a second source terminal S2 coupled to the first drain terminal D1, and two second source/drain extension areas E2 respectively coupled to the second drain terminal D2 and the second source terminal S2. The antifuse varactor 330 can be a MOS varactor, and has a third gate terminal G3, a third drain terminal D3, a third source terminal S3 coupled to the second drain terminal D2, and a third source/drain extension area E3 coupled with the third drain terminal D3 and the third source terminal S3 for shorting the third drain terminal D3 and the third source terminal S3.

Since the third source/drain extension area E3 is implanted into the substrate structure F-sub, it can be considered that the first gate terminal G1, the second gate terminal G2, and the third gate terminal G3 may each be formed to have a U shape to overlap three lateral sides of the substrate structure F-sub. As shown in FIG. 16, in between each of the gate terminals G1-G3 and the substrate structure F-sub is a respective gate oxide layer Ox1-Ox3.

Comparing with the OTP memory cell 200 illustrated in FIG. 5, the OTP memory cell 400, 400A, or 400B introduces three gate terminals G1-G3 which are formed deeper than three gate terminals of the OTP memory cell 200. Further, thicknesses of three gate terminals G1-G3 of the FinFET-based OTP memory cell 400, 400A, or 400B can be identical according to a standard of FinFET manufacture. Specifically, depths of at least one source/drain extension area may be designed according to the standard of FinFET manufacture. The substrate structure F-sub can be a P well over a silicon substrate.

Figure 17:
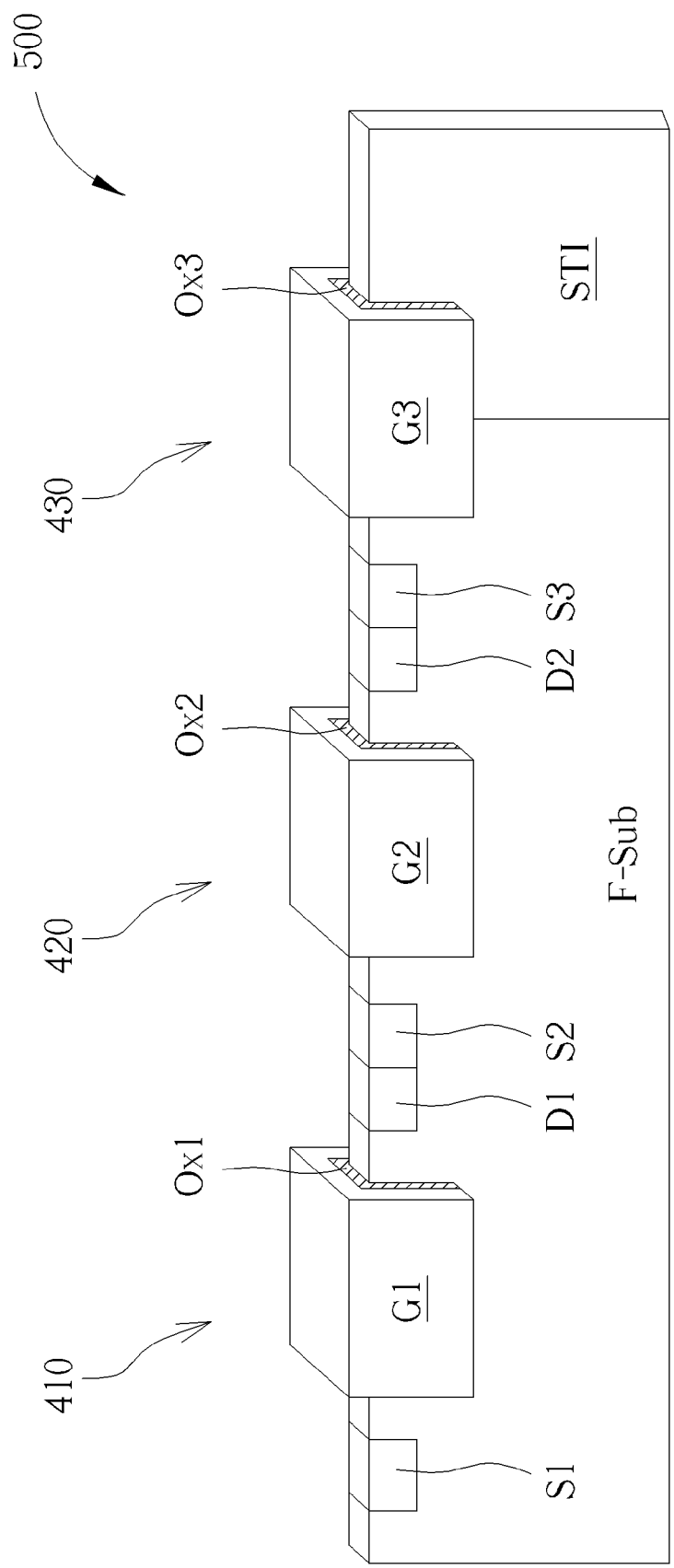
FIG. 17 is a diagram showing a structure of the OTP memory cell according to a tenth embodiment of the present invention.

FIG. 17 is a diagram showing a structure of the OTP memory cell 500 according to a tenth embodiment of the present invention. As shown in the figure, the OTP memory cell 500 includes a select gate transistor 410 and a following gate transistor 420 formed on a substrate structure F-sub, and an antifuse varactor 430 partially formed on the substrate structure F-sub.

The select gate transistor 410 has a first gate terminal G1, a first drain terminal D1, and a first source terminal S1. The following gate transistor 420 has a second gate terminal G2, a second drain terminal D2, and a second source terminal S2 coupled to the first drain terminal D1. The antifuse varactor 430 can be a MOS varactor, and has a third gate terminal G3, and a third source terminal S3 coupled to the second drain terminal D2. The antifuse varactor 430 may not have a drain terminal. Instead, a part of the third gate terminal G3 is formed above a shallow trench insulation area STI while the remaining part of the third gate terminal G3 is formed above the substrate structure F-sub. In this embodiment, there are no source/drain extension areas formed in between any of the source terminals and drain terminals of the select gate transistor 410 and the following gate transistor 420. And, there is no source/drain extension area in between the source terminal S3 and the shallow trench insulation area STI.

The first gate terminal G1, the second gate terminal G2, and the third gate terminal G3 may each be formed to have a U shape to overlap three lateral sides of the substrate structure F-sub. As shown in FIG. 17, in between each of the gate terminals G1-G3 and the substrate structure F-sub is a respective gate oxide layer Ox1-Ox3.

According to the above arrangement, the antifuse varactor 430 has no channel, therefore, when programming the OTP memory cell 500, the gate oxide layer Ox3 of the antifuse varactor 430 is ensured to be ruptured close to the third source terminal S3 because of the use of fin field effect transistor device (FinFET), so as to reduce possibility of current escaping through the channel.

Figure 18:
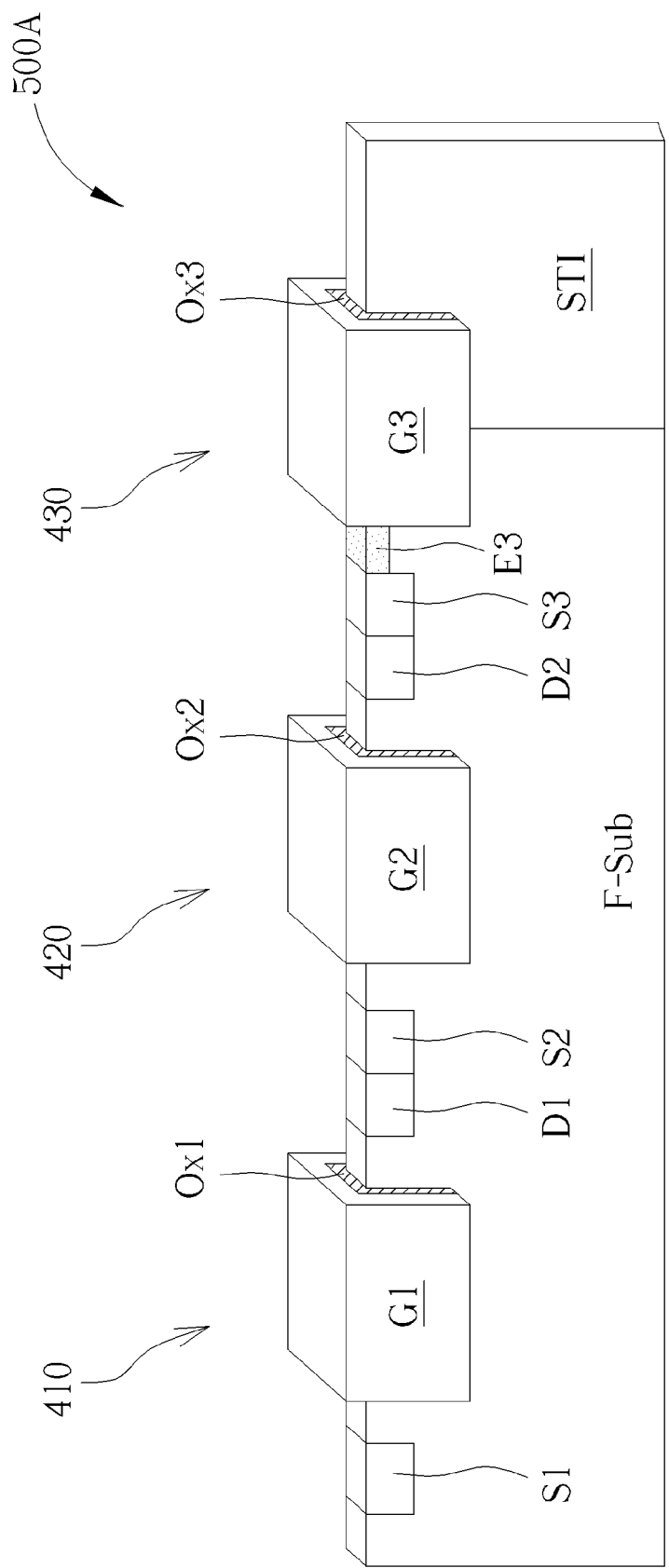
FIG. 18 is a diagram showing a structure of the OTP memory cell according to an eleventh embodiment of the present invention.

FIG. 18 is a diagram showing a structure of the OTP memory cell 500A according to an eleventh embodiment of the present invention. As shown in the figure, the OTP memory cell 500A includes a select gate transistor 410 and a following gate transistor 420 formed on a substrate structure F-sub, and an antifuse varactor 430 partially formed on the substrate structure F-sub.

The select gate transistor 410 has a first gate terminal G1, a first drain terminal D1, and a first source terminal S1. The following gate transistor 420 has a second gate terminal G2, a second drain terminal D2, and a second source terminal S2 coupled to the first drain terminal D1. The antifuse varactor 430 can be a MOS varactor, and has a third gate terminal G3, and a third source terminal S3 coupled to the second drain terminal D2. The antifuse varactor 430 may not have a drain terminal. Instead, a part of the third gate terminal G3 is formed above a shallow trench insulation area STI. The antifuse varactor 430 can further have a third source/drain extension area E3 coupled with the third source terminal S3 and shallow trench insulation area STI such that the rest of the third gate terminal G3 is formed right above the third source/drain extension area E3. In this embodiment, there are no source/drain extension areas formed in between any of the source terminals and drain terminals of the select gate transistor 410 and the following gate transistor 420.

Since the third source/drain extension area E3 is implanted into the substrate structure F-sub, it can be considered that the first gate terminal G1, the second gate terminal G2, and the third gate terminal G3 may each be formed to have a U shape to overlap three lateral sides of the substrate structure F-sub. As shown in FIG. 18, in between each of the gate terminals G1-G3 and the substrate structure F-sub is a respective gate oxide layer Ox1-Ox3. Further, although the third source/drain extension area E3 is used to couple with the third source terminal S3, the present invention is not limited to the structure illustrated in FIG. 18. For example, in other embodiments, at least one source/drain extension area can be used to arbitrarily couple with a source terminal and/or a drain terminal corresponding to the select gate transistor 410 or the following gate transistor 420.

Figure 19:
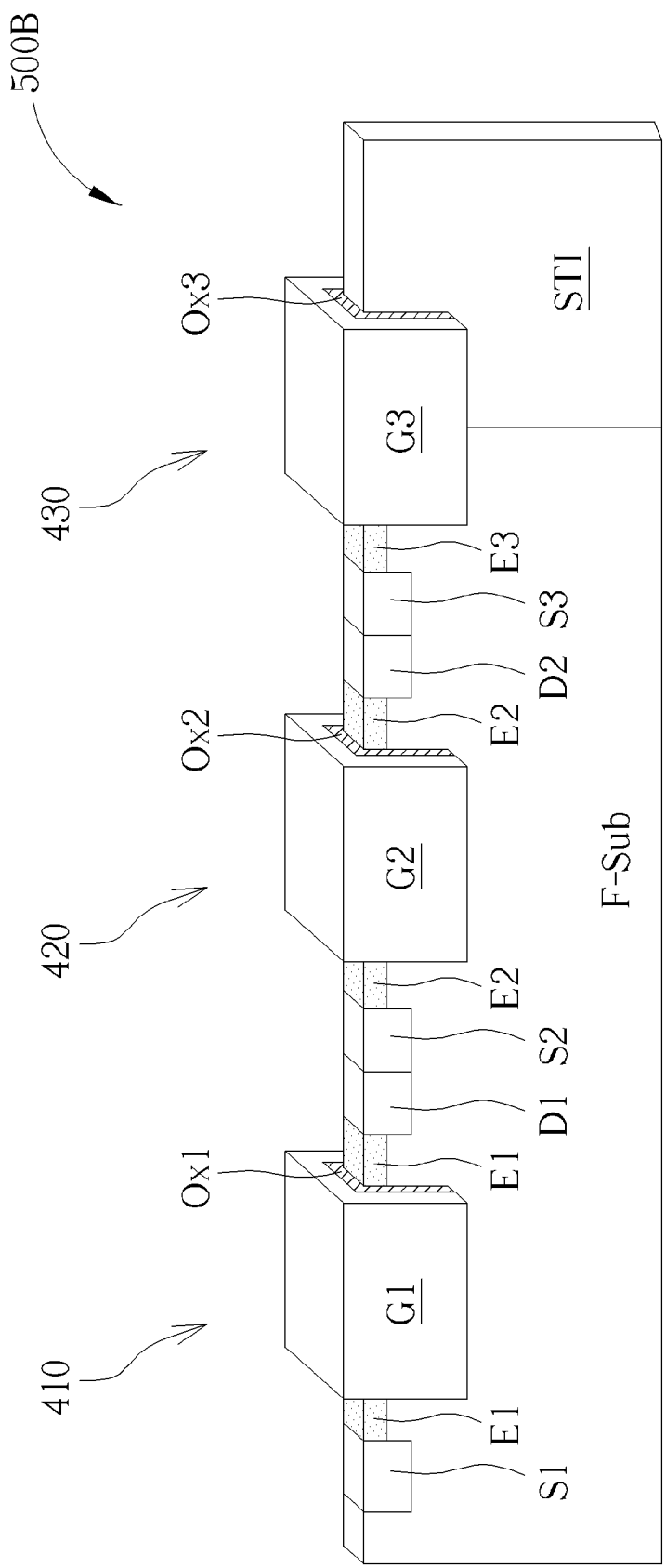
FIG. 19 is a diagram showing a structure of the OTP memory cell according to a twelfth embodiment of the present invention.

FIG. 19 is a diagram showing a structure of the OTP memory cell 500B according to a twelfth embodiment of the present invention. As shown in the figure, the OTP memory cell 500B includes a select gate transistor 410 and a following gate transistor 420 formed on a substrate structure F-sub, and an antifuse varactor 430 partially formed on the substrate structure F-sub.

The select gate transistor 410 has a first gate terminal G1, a first drain terminal D1, a first source terminal S1, and two first source/drain extension areas E1 respectively coupled to the first drain terminal D1 and the first source terminal S1. The following gate transistor 420 has a second gate terminal G2, a second drain terminal D2, a second source terminal S2 coupled to the first drain terminal D1, and two second source/drain extension areas E2 respectively coupled to the second drain terminal D2 and the second source terminal S2. The antifuse varactor 430 can be a MOS varactor, and has a third gate terminal G3, and a third source terminal S3 coupled to the second drain terminal D2. The antifuse varactor 430 may not have a drain terminal. Instead, a part of the third gate terminal G3 is formed above a shallow trench insulation area STI. The antifuse varactor 430 can further have a third source/drain extension area E3 coupled with the third source terminal S3 and shallow trench insulation area STI such that the rest of the third gate terminal G3 is formed above the third source/drain extension area E3.

Since the third source/drain extension area E3 is implanted into the substrate structure F-sub, it can be considered that the first gate terminal G1, the second gate terminal G2, and the third gate terminal G3 may each be formed to have a U shape to overlap three lateral sides of the substrate structure F-sub. As shown in FIG. 19, in between each of the gate terminals G1-G3 and the substrate structure F-sub is a respective gate oxide layer Ox1-Ox3.

Comparing with the OTP memory cell 200C illustrated in FIG. 8, the OTP memory cell 500, 500A, or 500B introduces three gate terminals G1-G3 which are formed deeper than three gate terminals of the OTP memory cell 200C. Further, thicknesses of three gate terminals G1-G3 of the FinFET-based OTP memory cell 500, 500A, or 500B can be identical according to a standard of FinFET manufacture. Specifically, depths of at least one source/drain extension area may be designed according to the standard of FinFET manufacture. The substrate structure F-sub can be a P well over a silicon substrate.

Figure 20:
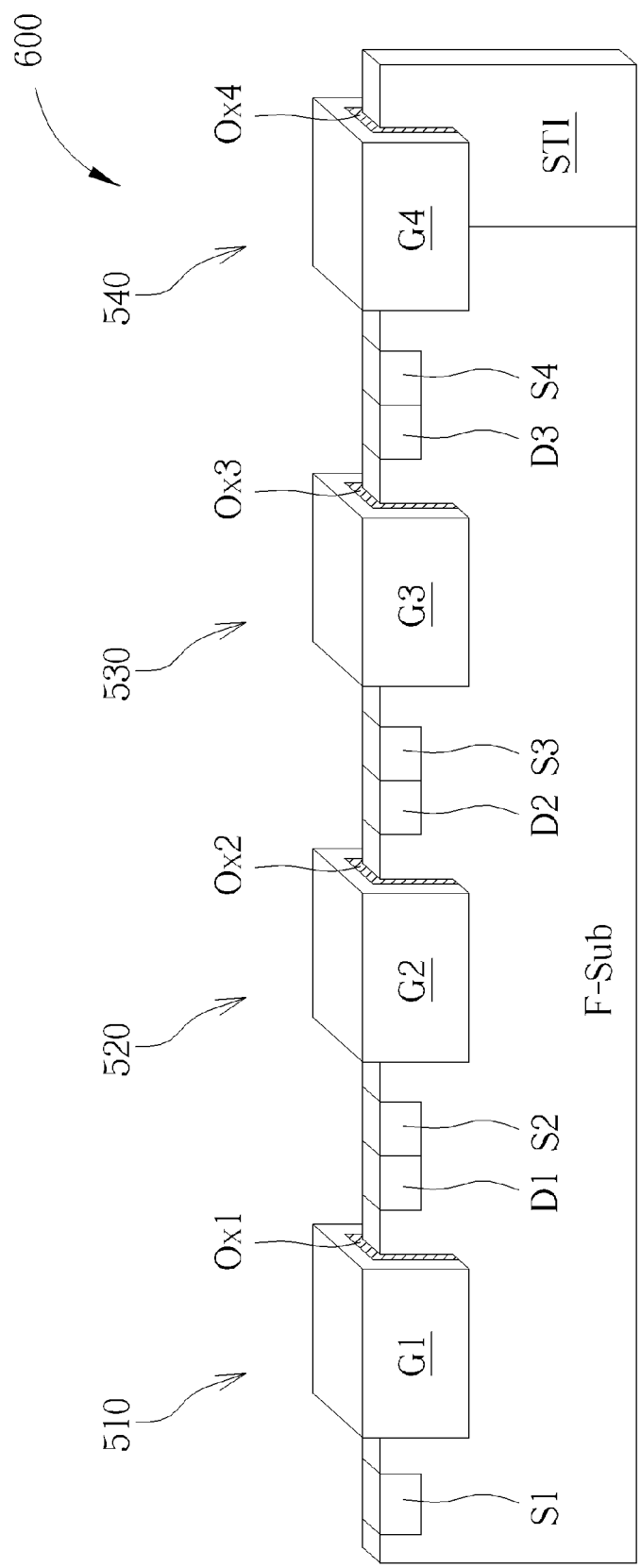
FIG. 20 is a diagram showing a structure of the OTP memory cell according to a thirteenth embodiment of the present invention.

FIG. 20 is a diagram showing a structure of the OTP memory cell 600 according to a thirteenth embodiment of the present invention. As shown in the figure, the OTP memory cell 600 includes a select gate transistor 510, a following gate transistor 520, an antifuse varactor 530 formed on a substrate structure F-sub, and a dummy transistor 540 partially formed on the substrate structure F-sub.

The select gate transistor 510 has a first gate terminal G1, a first drain terminal D1, and a first source terminal S1. The following gate transistor 520 has a second gate terminal G2, a second drain terminal D2, and a second source terminal S2 coupled to the first drain terminal D1. The antifuse varactor 530 can be a MOS varactor, and has a third gate terminal G3, a third drain terminal D3, and a third source terminal S3 coupled to the second drain terminal D2. The dummy transistor 540 has a fourth gate terminal G4, and a fourth source terminal S4 coupled to the third drain terminal D3. The dummy transistor 540 may not have a drain terminal. Instead, a part of the fourth gate terminal G4 is formed above a shallow trench insulation area STI while the remaining part of the fourth gate terminal G4 is formed above the substrate structure F-sub. In this embodiment, there are no source/drain extension areas formed in between any of the source terminals and drain terminals of the select gate transistor 510, the following gate transistor 520, and the antifuse varactor 530. And, there is no source/drain extension area in between the source terminal S4 and the shallow trench insulation area STI.

The first gate terminal G1, the second gate terminal G2, the third gate terminal G3, and the fourth gate terminal G4 may each be formed to have a U shape to overlap three lateral sides of the substrate structure F-sub. As shown in FIG. 20, in between each of the gate terminals G1-G4 and the substrate structure F-sub is a respective gate oxide layer Ox1-Ox4.

Figure 21:
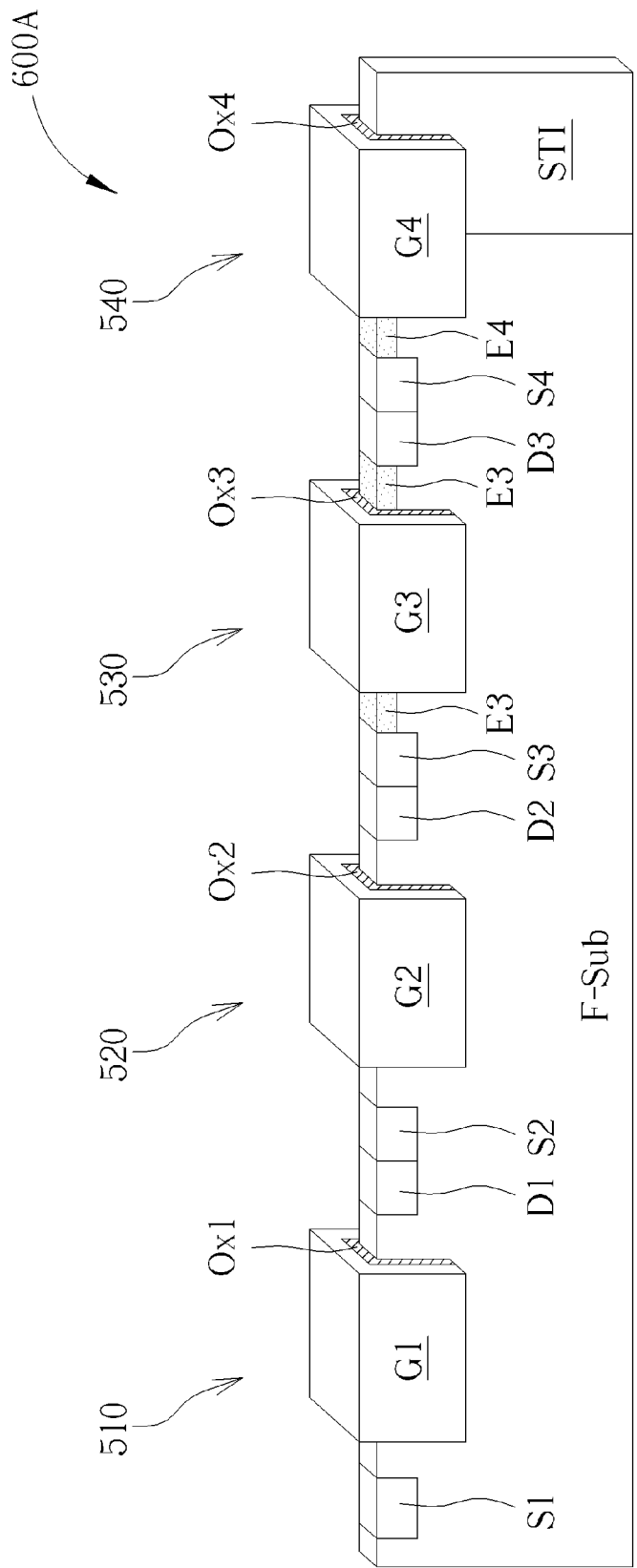
FIG. 21 is a diagram showing a structure of the OTP memory cell according to a fourteenth embodiment of the present invention.

FIG. 21 is a diagram showing a structure of the OTP memory cell 600A according to a fourteenth embodiment of the present invention. As shown in the figure, the OTP memory cell 600A includes a select gate transistor 510, a following gate transistor 520, an antifuse varactor 530 formed on a substrate structure F-sub, and a dummy transistor 540 partially formed on the substrate structure F-sub.

The select gate transistor 510 has a first gate terminal G1, a first drain terminal D1, and a first source terminal S1. The following gate transistor 520 has a second gate terminal G2, a second drain terminal D2, and a second source terminal S2 coupled to the first drain terminal D1. The antifuse varactor 530 can be a MOS varactor, and has a third gate terminal G3, a third drain terminal D3, and a third source terminal S3 coupled to the second drain terminal D2. The dummy transistor 540 has a fourth gate terminal G4, and a fourth source terminal S4 coupled to the third drain terminal D3. The dummy transistor 540 may not have a drain terminal. Instead, a part of the fourth gate terminal G4 is formed above a shallow trench insulation area STI. The antifuse varactor 530 can further have a third source/drain extension area E3 coupled with the third source terminal S3 and third drain terminal D3 such that the third gate terminal G3 is formed right above the third source/drain extension area E3. The dummy transistor 540 can further have a fourth source/drain extension area E4 coupled with the fourth source terminal S4. The fourth source/drain extension area E4 may or may not be extended from the fourth source terminal S4 to the shallow trench insulation area STI. In this embodiment, there are no source/drain extension areas formed in between any of the source terminals and drain terminals of the select gate transistor 510 and the following gate transistor 520.

Since the third source/drain extension area E3 is implanted into the substrate structure F-sub, it can be considered that the first gate terminal G1, the second gate terminal G2, the third gate terminal G3, and the fourth gate terminal G4 may each be formed to have a U shape to overlap three lateral sides of the substrate structure F-sub. As shown in FIG. 21, in between each of the gate terminals G1-G4 and the substrate structure F-sub is a respective gate oxide layer Ox1-Ox4. Further, in the embodiment, the third source/drain extension area E3 is used to couple with the third drain terminal D3 and the third source terminal S3. The fourth source/drain extension area E4 is used to couple with the fourth source terminal S4. The present invention is not limited to the structure illustrated in FIG. 21. For example, in other embodiments, at least one source/drain extension area can be used to arbitrarily couple with a source terminal and/or a drain terminal corresponding to the select gate transistor 510 or the following gate transistor 520.

Figure 22:
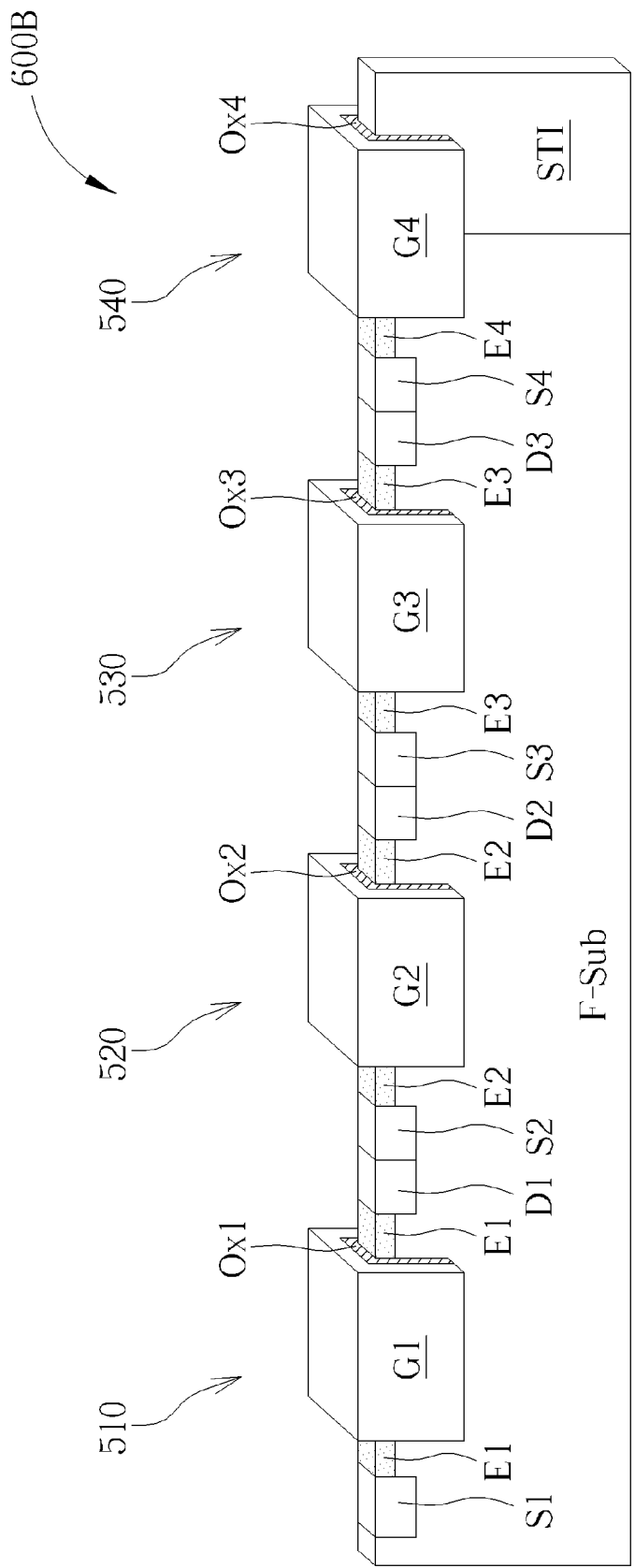
FIG. 22 is a diagram showing a structure of the OTP memory cell according to a fifteenth embodiment of the present invention.

FIG. 22 is a diagram showing a structure of the OTP memory cell 600B according to a fifteenth embodiment of the present invention. As shown in the figure, the OTP memory cell 600B includes a select gate transistor 510, a following gate transistor 520, an antifuse varactor 530 formed on a substrate structure F-sub, and a dummy transistor 540 partially formed on the substrate structure F-sub.

The select gate transistor 510 has a first gate terminal G1, a first drain terminal D1, a first source terminal S1, and two first source/drain extension areas E1 respectively coupled to the first drain terminal D1 and the first source terminal S1. The following gate transistor 520 has a second gate terminal G2, a second drain terminal D2, a second source terminal S2 coupled to the first drain terminal D1, and two second source/drain extension areas E2 respectively coupled to the second drain terminal D2 and the second source terminal S2. The antifuse varactor 530 can be a MOS varactor, and has a third gate terminal G3, a third drain terminal D3, and a third source terminal S3 coupled to the second drain terminal D2. The dummy transistor 540 has a fourth gate terminal G4, and a fourth source terminal S4 coupled to the third drain terminal D3. The dummy transistor 540 may not have a drain terminal. Instead, a part of the fourth gate terminal G4 is formed right above the shallow trench insulation area STI. The antifuse varactor 530 can further have a third source/drain extension area E3 coupled with the third source terminal S3 and third drain terminal D3 such that the third gate terminal G3 is formed right above the third source/drain extension area E3. The dummy transistor 540 can further have a fourth source/drain extension area E4 coupled with the fourth source terminal S4. The fourth source/drain extension area E4 may or may not be extended from the fourth source terminal S4 to the shallow trench insulation area STI.

Since the third source/drain extension area E3 is implanted into the substrate structure F-sub, it can be considered that the first gate terminal G1, the second gate terminal G2, the third gate terminal G3, and the fourth gate terminal G4 may each be formed to have a U shape to overlap three lateral sides of the substrate structure. As shown in FIG. 22, in between each of the gate terminals G1-G4 and the substrate structure F-sub is a respective gate oxide layer Ox1-Ox4.

Comparing with the OTP memory cell 200 illustrated in FIG. 5, the OTP memory cell 600, 600A, or 600B introduces the dummy transistor 540. Additionally, the OTP memory cell 600, 600A, or 600B also introduces three gate terminals G1-G3 which are formed deeper than three gate terminals of the OTP memory cell 200. Further, thicknesses of three gate terminals G1-G3 of the FinFET-based OTP memory cell 600, 600A, or 600B can be identical according to a standard of FinFET manufacture. Specifically, depths of at least one source/drain extension area may be designed according to the standard of FinFET manufacture. The substrate structure F-sub can be a P well over a silicon substrate. Further, the fourth gate terminal G4 of the dummy transistor 540 can be used to receive arbitrary bias voltage or no bias voltage without any performance disturbance of the OTP memory cells 600, 600A, and 600B. Also, the fourth gate terminal G4 of the dummy transistor 540 can be placed on a floating status (i.e., floating node) without performance loss. Any technical modification of the fourth gate terminal G4 of the dummy transistor 540 falls within the scope of the invention.

Figure 23:
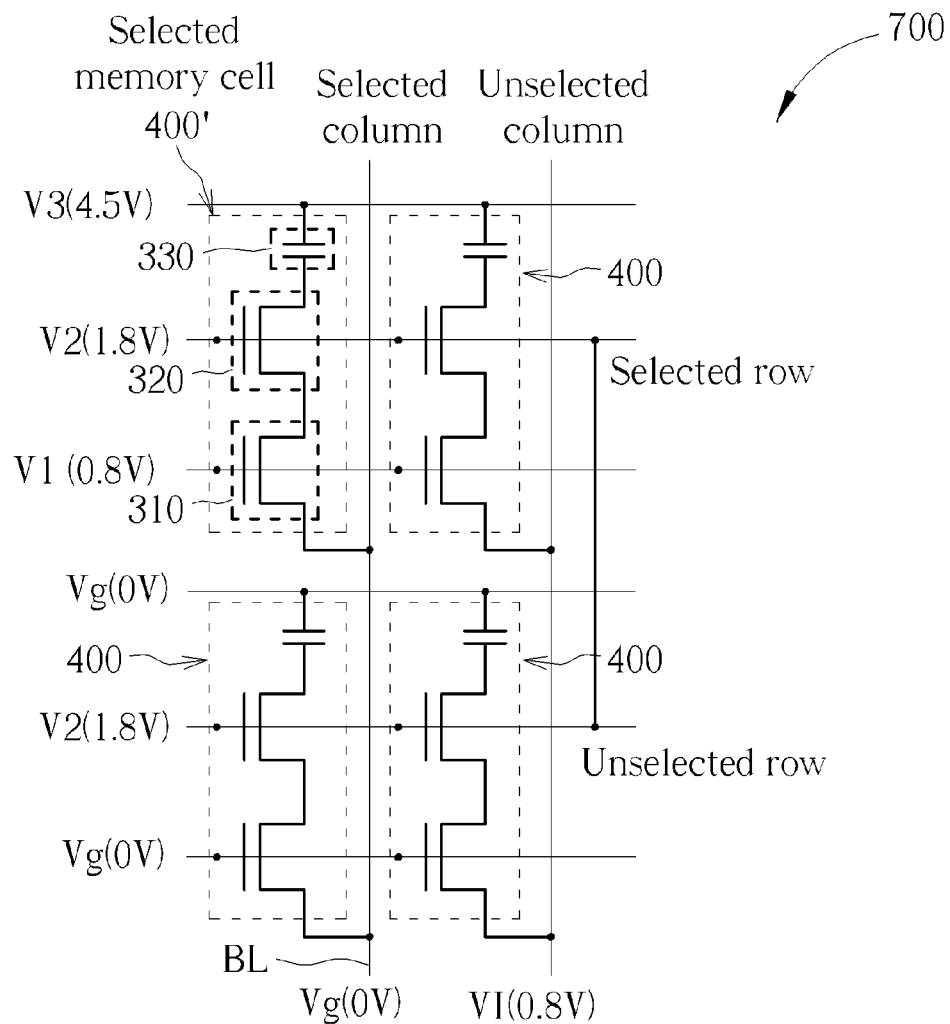
FIG. 23 is a diagram showing a method for programming a memory array comprising the OTP memory cells shown in FIG. 14.

FIG. 23 is a diagram showing a method for programming a memory array 700. Here, the memory array 700 is regarded as an equivalent circuit including one of the OTP memory cells shown in FIG. 14 to FIG. 22. For presentation simplicity, the memory array 700 is represented to include the OTP memory cell 400 in FIG. 14. As shown in FIG. 23, when programming the memory array 700 including a plurality of OTP memory cells 400', 400 of the present invention, a first voltage V1 (such as 0.8V) is provided to the first gate terminals of OTP memory cells at a selected row, a second voltage V2 (such as 1.8V) is provided to all of the second gate terminals of the memory array 400, and a third voltage V3 (such as 4.5V) is provided to the third gate terminals of the selected memory cell 400'. Besides, a ground voltage Vg (such as 0V) is provided to the first source terminals of a selected column via a bit line BL. Particularly, the first voltage V1, the second voltage V2, and the third voltage V3 can be set respectively within ranges of voltage values. For example, a range of the first voltage V1 can be set from 0.6 volts to 1.4 volts. A range of the first voltage V2 can be set from 1.2 volts to 2.2 volts. A range of the first voltage V3 can be set from 3.5 volts to 5 volts.

According to the above arrangement, the antifuse varactor 330 of the selected memory cell 400' can be ruptured to be a resistor by the third voltage V3, such that data of logic "1" is written into the selected OTP memory cell 400' at the selected row and selected column. On the other hand, for writing data of logic "0" into the selected OTP memory cell 400' at the selected row and column, the voltage level at the third gate terminal can be set at 0V.

In addition, in FIG. 23, for the unselected OTP memory cell 400 at the unselected row and selected column, the ground voltage Vg is provided to the first and third gate terminals of the unselected row; for the unselected OTP memory cell 400 at the selected row and unselected column, the first voltage V1 is provided to the first source terminal of the OTP memory cell at the unselected column; and for the unselected OTP memory cells 400 at the unselected row and unselected column, the ground voltage Vg is provided to the first and third gate terminals of the OTP memory cell, and the first voltage V1 is provided to the first source terminals of the OTP memory cell. Therefore, the unselected OTP memory cells 400 at the unselected row and/or unselected column can be set in a program inhibition status.

In the embodiment of FIG. 23, the OTP memory cell is illustrated by the OTP memory cell 700 according to the seventh embodiment of FIG. 14. However, as aforementioned above, the OTP memory cells of FIG. 23 can also be replaced by the OTP memory cell 400A, 400B, 500, 500A, 500B, 600, 600A, and 600B according to the seventh to fifteenth embodiments of the present invention. The voltage ranges shown in FIG. 23 are applicable to a memory array made in a FinFET process, and the present invention is not limited by the above voltage ranges. In other embodiments of the present invention, the voltage ranges can be changed according to processes at different scales.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one time programmable (OTP) memory cell, comprising:
   a substrate structure;
   a shallow trench insulation area adjoining the substrate structure;
   a select gate transistor formed on the substrate structure, the select gate transistor having a first gate terminal, a first drain terminal, and a first source terminal;
   a following gate transistor formed on the substrate structure, the following gate transistor having a second gate terminal, a second drain terminal, and a second source terminal coupled to the first drain terminal;
   an antifuse varactor formed on the substrate structure, the antifuse varactor having a third gate terminal, a third drain terminal, and a third source terminal coupled to the second drain terminal; and
   a dummy transistor partially formed on the substrate structure, the dummy transistor having a fourth gate terminal, and a fourth source terminal coupled to the third drain terminal;
   wherein a part of the fourth gate terminal is formed above the shallow trench insulation area.

2. The OTP memory cell of claim 1, wherein the substrate structure is a P well over a silicon substrate, and all source terminals and drain terminals are formed by an epitaxial silicon phosphorous (SiP) or silicon carbide (SiC) process.

3. A method for programming a memory array, comprising:
   providing the memory array comprising a plurality of the OTP memory cells of claim 1;
   providing a first voltage ranging from 0.6 volts to 1.4 volts to the first gate terminals of the OTP memory cells at a selected row;
   providing a second voltage ranging from 1.2 volts to 2.2 volts to all of the second gate terminals of the memory array;
   providing a third voltage ranging from 3.5 volts to 5 volts to the third gate terminals of the OTP memory cells at the selected row; and
   providing a ground voltage to the first source terminals of the OTP memory cells at a selected column;
   wherein the third voltage is greater than the first and the second voltages, and the first to third voltages are greater than the ground voltage.

4. The method of claim 3, further comprising:
   providing the first voltage to the first source terminals of the OTP memory cells at an unselected column.

5. The method of claim 3, further comprising:
   providing the ground voltage to the first gate terminals of the OTP memory cells at an unselected row; and
   providing the ground voltage to the third gate terminals of the OTP memory cells at the unselected row.

6. The method of claim 3, further comprising:
   providing the ground voltage to the first gate terminals of the OTP memory cells at an unselected row;
   providing the ground voltage to the third gate terminals of the OTP memory cells at the unselected row; and
   providing the first voltage to the first source terminals of an unselected column.

7. The method of claim 3, wherein the first gate terminal, second gate terminal, third gate terminal, and the fourth gate terminal are formed on a first gate oxide layer with a same first thickness.

8. The OTP memory cell of claim 1, wherein the antifuse varactor further has a third source/drain extension area coupled to the third source terminal and the third drain terminal for shorting the third drain terminal and the third source terminal, and the dummy transistor further has a fourth source/drain extension area coupled to the fourth source terminal.

9. A method for programming a memory array, comprising:
   providing the memory array comprising a plurality of the OTP memory cells of claim 8;
   providing a first voltage ranging from 0.6 volts to 1.4 volts to the first gate terminals of the OTP memory cells at a selected row;
   providing a second voltage ranging from 1.2 volts to 2.2 volts to all of the second gate terminals of the memory array;
   providing a third voltage ranging from 3.5 volts to 5 volts to the third gate terminals of the OTP memory cells at the selected row; and
   providing a ground voltage to the first source terminals of the OTP memory cells at a selected column;
   wherein the third voltage is greater than the first and the second voltages, and the first to third voltages are greater than the ground voltage.

10. The method of claim 9, further comprising:
    providing the first voltage to the first source terminals of the OTP memory cells at an unselected column.

11. The method of claim 9, further comprising:
    providing the ground voltage to the first gate terminals of the OTP memory cells at an unselected row; and
    providing the ground voltage to the third gate terminals of the OTP memory cells at the unselected row.

12. The method of claim 9, further comprising:
    providing the ground voltage to the first gate terminals of the OTP memory cells at an unselected row;
    providing the ground voltage to the third gate terminals of the OTP memory cells at the unselected row; and
    providing the first voltage to the first source terminals of an unselected column.

13. The OTP memory cell of claim 8, wherein the select gate transistor further has two first source/drain extension areas respectively coupled to the first drain terminal and the first source terminal, and the following gate transistor further has two second source/drain extension areas respectively coupled to the second drain terminal and the second source terminal.

14. A method for programming a memory array, comprising:
    providing the memory array comprising a plurality of the OTP memory cells of claim 13;
    providing a first voltage ranging from 0.6 volts to 1.4 volts to the first gate terminals of the OTP memory cells at a selected row;
    providing a second voltage ranging from 1.2 volts to 2.2 volts to all of the second gate terminals of the memory array;
    providing a third voltage ranging from 3.5 volts to 5 volts to the third gate terminals of the OTP memory cells at the selected row; and
    providing a ground voltage to the first source terminals of the OTP memory cells at a selected column;
    wherein the third voltage is greater than the first and the second voltages, and the first to third voltages are greater than the ground voltage.

15. The method of claim 14, further comprising:
    providing the first voltage to the first source terminals of the OTP memory cells at an unselected column.

16. The method of claim 14, further comprising:
providing the ground voltage to the first gate terminals of the OTP memory cells at an unselected row; and
providing the ground voltage to the third gate terminals of the OTP memory cells at the unselected row.

17. The method of claim 14, further comprising:
providing the ground voltage to the first gate terminals of the OTP memory cells at an unselected row;
providing the ground voltage to the third gate terminals of the OTP memory cells at the unselected row; and
providing the first voltage to the first source terminals of an unselected column.

* * * * *